(12) United States Patent
Yamamoto et al.

(10) Patent No.: US 10,951,850 B2
(45) Date of Patent: Mar. 16, 2021

(54) IMAGING DEVICE AND ELECTRONIC DEVICE

(71) Applicant: Semiconductor Energy Laboratory Co., Ltd., Atsugi (JP)

(72) Inventors: Roh Yamamoto, Toyama (JP); Takahiro Fukutome, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/628,914

(22) PCT Filed: Jul. 2, 2018

(86) PCT No.: PCT/IB2018/054888
§ 371 (c)(1),
(2) Date: Jan. 6, 2020

(87) PCT Pub. No.: WO2019/012369
PCT Pub. Date: Jan. 17, 2019

(65) Prior Publication Data
US 2020/0145600 A1    May 7, 2020

(30) Foreign Application Priority Data
Jul. 14, 2017  (JP) .............................. JP2017-137910

(51) Int. Cl.
| H04N 5/378 | (2011.01) |
| G06N 3/04 | (2006.01) |
| H01L 27/146 | (2006.01) |

(52) U.S. Cl.
CPC ............... *H04N 5/378* (2013.01); *G06N 3/04* (2013.01); *H01L 27/14612* (2013.01);
(Continued)

(58) Field of Classification Search
CPC ........ H04N 5/378; H04N 5/225; H04N 5/365; H04N 5/3745; G06N 3/04; G06N 3/06;
(Continued)

(56) References Cited

U.S. PATENT DOCUMENTS 6,084,981 A * 7/2000 Horiba ..................... G06K 9/40
382/157
7,151,844 B2 * 12/2006 Stevenson .......... G06K 9/00798
382/104
(Continued)

FOREIGN PATENT DOCUMENTS

| JP | 2016-123087 A | 7/2016 |
| JP | 2017-054502 A | 3/2017 |

(Continued)

OTHER PUBLICATIONS

International Search Report (Application No. PCT/IB2018/054888) dated Oct. 16, 2018.
(Continued)

*Primary Examiner* — Jason A Flohre
(74) *Attorney, Agent, or Firm* — Robinson Intellectual Property Law Office; Eric J. Robinson

(57) ABSTRACT

An offset component of multiplication by a transistor is to be reduced. An imaging device includes a pixel region, a first circuit, a second circuit, a third circuit, and a fourth circuit. The pixel region includes a plurality of pixels, and a pixel includes a first transistor. An offset potential and a weight potential are supplied to the pixel selected by the first circuit and the second circuit. The pixel obtains a first signal by photoelectric conversion with use of light. The first transistor multiplies the first signal by the weight potential. The first transistor generates a first offset term and a second offset term with use of a multiplication term of the first signal by the weight potential and the offset potential. The third circuit subtracts the first offset term, and the fourth circuit subtracts
(Continued)

the second offset term. The fourth circuit determines the multiplication term, and the fourth circuit outputs a determination result through the neural network interface.

13 Claims, 15 Drawing Sheets

(52) U.S. Cl.
CPC .. *H01L 27/14636* (2013.01); *H01L 27/14621* (2013.01); *H01L 27/14623* (2013.01); *H01L 27/14627* (2013.01)

(58) Field of Classification Search
CPC ......... H01L 27/14612; H01L 27/14636; H01L 27/14621; H01L 27/14623; H01L 27/14627; H01L 27/146; G06G 7/60
See application file for complete search history.

(56) References Cited

U.S. PATENT DOCUMENTS

| | | | | |
|---|---|---|---|---|
| 9,762,834 | B2* | 9/2017 | Govil | H04N 5/23229 |
| 9,773,832 | B2 | 9/2017 | Kurokawa | |
| 9,883,129 | B2 | 1/2018 | Kurokawa | |
| 10,074,687 | B2 | 9/2018 | Kurokawa | |
| 2005/0018062 | A1* | 1/2005 | Chiang | H04N 5/357 348/294 |
| 2016/0172410 | A1 | 6/2016 | Kurokawa | |
| 2016/0328642 | A1* | 11/2016 | Himebaugh | G06N 3/0635 |
| 2017/0063351 | A1 | 3/2017 | Kurokawa | |
| 2017/0094220 | A1* | 3/2017 | Kurokawa | H01L 27/14616 |
| 2018/0129893 | A1* | 5/2018 | Son | G06N 3/0454 |
| 2019/0067360 | A1 | 2/2019 | Kurokawa | |

FOREIGN PATENT DOCUMENTS

| | | |
|---|---|---|
| JP | 2017-063420 A | 3/2017 |
| WO | WO-2017/037568 | 3/2017 |
| WO | WO-2018/211366 | 11/2018 |

OTHER PUBLICATIONS

Written Opinion (Application No. PCT/IB2018/054888) dated Oct. 16, 2018.
Jia. P. et al., "Convolutional neural network based classification for hyperspectral data", 2016 IEEE International Geoscience and Remote Sensing Symposium (IGARSS), Jul. 10, 2016, pp. 5075-5078.
European Search Report (Application No. 18831474.4) dated Dec. 2, 2020.

* cited by examiner

FIG. 12A1
FIG. 12B1
FIG. 12A2
FIG. 12B2
FIG. 12A3
FIG. 12B3
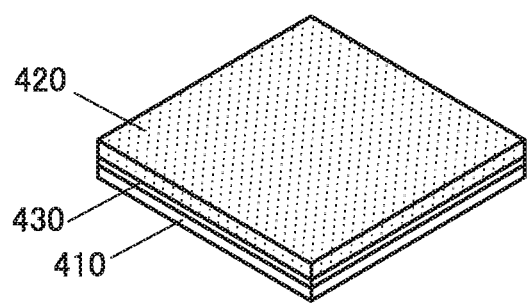
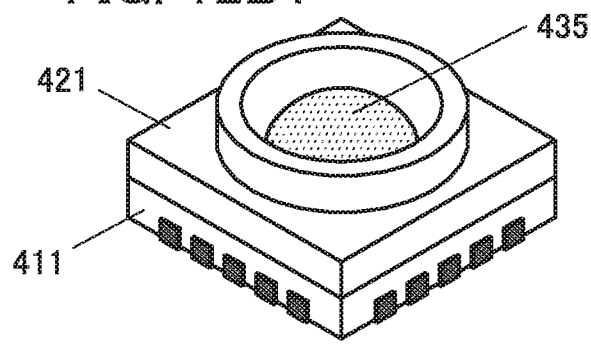
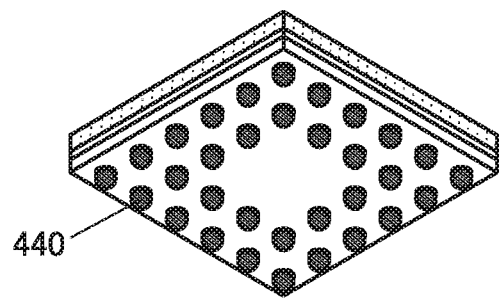
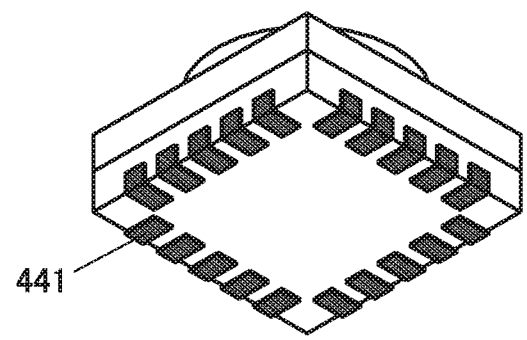
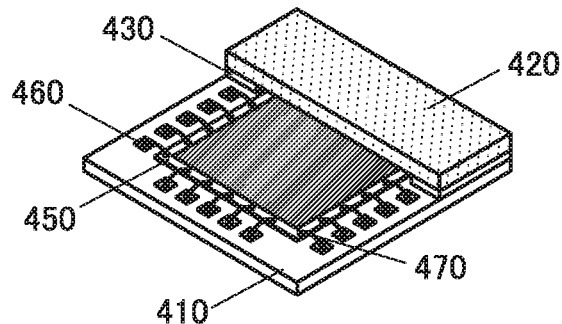
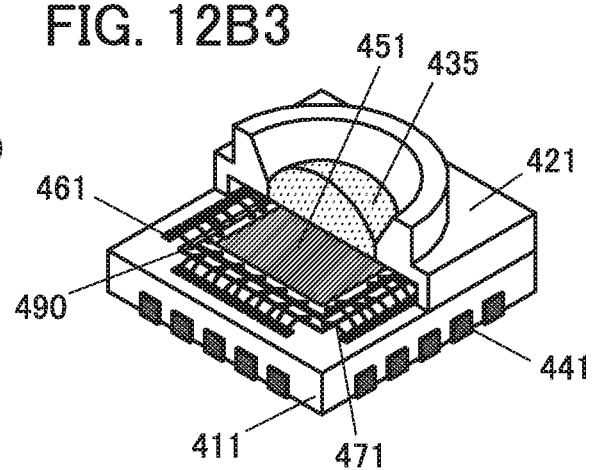

IMAGING DEVICE AND ELECTRONIC DEVICE

TECHNICAL FIELD

One embodiment of the present invention relates to an imaging device and an electronic device.

Note that one embodiment of the present invention is not limited to the above technical field. The technical field of one embodiment of the invention disclosed in this specification and the like relates to an object, a method, or a manufacturing method. In particular, one embodiment of the present invention relates to a semiconductor device, a display device, a light-emitting device, a power storage device, a memory device, a driving method thereof, or a manufacturing method thereof.

In this specification and the like, a semiconductor device means an element, a circuit, a device, or the like that can function by utilizing semiconductor characteristics. For example, a semiconductor element such as a transistor or a diode is a semiconductor device. For another example, a circuit including a semiconductor element is a semiconductor device. For another example, a device provided with a circuit including a semiconductor element is a semiconductor device.

BACKGROUND ART

With the development of information technology such as IoT (Internet of things) or AI (Artificial Intelligence), the amount of handled data has been showing an increasing tendency. In order that electronic devices utilize information technology such as IoT or AI, dispersive control of a large amount of data has been needed.

An efficient method for managing image data is required because the amount of data increases with a higher definition and a higher-level gray scale of a display device. An increase in the data amount increases the amount of operations for processing image data, leading to an increase in power consumption and time for operation processing.

Improvement in image recognition with use of AI has been attracting attention for an image system of an in-vehicle electronic device, an image system that monitors a moving target, and the like. For example, a technology for adding an arithmetic function to an imaging device is disclosed in Patent Document 1.

REFERENCES

Patent Documents

[Patent Document 1] Japanese Published Patent Application No. 2016-123087

SUMMARY OF THE INVENTION

Problems to be Solved by the Invention

Imaging devices provided with a solid-state imaging element such as a CMOS image sensor can capture a high quality image easily owing to the development of technology. In the next generation, imaging devices need to have more intelligent functions.

In order to recognize a target from image data, advanced image processing is required. In the advanced image processing, various kinds of analysis processing for analyzing an image, such as filter processing and comparison processing, are used. In the analysis processing for image processing, the amount of operations is increased in accordance with the number of pixels to be processed, and the processing time is increased in accordance with the amount of operations. In an in-vehicle image system, for example, there is a problem that an increase in processing time affects safety. In addition, in an image system, there is a challenge that power consumption is increased because of an increase in the amount of operations.

In view of the above problems, an object of one embodiment of the present invention is to provide an imaging device with a novel structure. Another object of one embodiment of the present invention is to provide an imaging device having a pooling layer of a neural network. Another object of one embodiment of the present invention is to provide an imaging device with a novel structure that can shorten processing time by reducing the amount or operations. Another object of one embodiment of the present invention is to provide an imaging device with a novel structure that can reduce power consumption.

Note that the descriptions of these objects do not disturb the existence of other objects. One embodiment of the present invention does not need to achieve all the objects. Other objects will be apparent from the description of the specification, the drawings, the claims, and the like, and other objects can be derived from the description of the specification, the drawings, the claims, and the like.

Note that the objects of one embodiment of the present invention are not limited to the objects listed above. The objects listed above do not preclude the existence of other objects. The other objects are the objects that are not described in this section and will be described below. Objects that are not described in this section will be apparent from the description of the specification, the drawings, and the like and can be derived from the description by those skilled in the art. One embodiment of the present invention is to solve at least one object of the objects listed above and/or the other objects.

Means for Solving the Problems

One embodiment of the present invention is an imaging device including a neural network interface with the following characteristics. The imaging device includes a pixel region (10), a first circuit (11), a second circuit (12), a third circuit (13), a fourth circuit (14), and a first signal line Wx. The pixel region includes a plurality of pixels (P), and the pixel includes a first transistor (25). The fourth circuit includes the neural network interface. The pixel is electrically connected to the third circuit through the first signal line Wx, and the third circuit is electrically connected to the fourth circuit. The first circuit has a function of supplying a scan signal to the pixel, and the second circuit has a function of supplying a weight potential to the pixel selected by the scan signal. The pixel has a function of obtaining a first signal by photoelectric conversion with use of light. The pixel has a function of multiplying the first signal by the weight potential with use of the first transistor. The first transistor has a function of generating a multiplication term of the first signal by the weight potential, a first offset term (C4), and a second offset term (C6). The third circuit has a function of subtracting the first offset term, and the fourth circuit has a function of subtracting the second offset term. The fourth circuit has a function of determining the multiplication term, and the fourth circuit outputs a determination result through the neural network interface.

The imaging device with the above structure and the following characteristics is preferable. The second circuit also has a function of supplying an offset potential to the pixel selected by the scan signal, and the pixel has a function of generating a second signal by adding the offset potential to the first signal. The pixel has a function of generating a third signal by adding the weight potential to the offset potential, and the pixel has a function of generating a fourth signal by adding the offset potential and the weight potential to the first signal. The first transistor has a function of generating a fifth signal by multiplying the second signal at a predetermined magnification. The first transistor has a function of generating a sixth signal by multiplying the third signal at a predetermined magnification. The first transistor has a function of generating a seventh signal by multiplying the fourth signal at a predetermined magnification. The third circuit has a function of storing the second signal, and the third circuit has a function of generating an eighth signal by performing an operation on the seventh signal and the fifth signal. The fourth circuit has a function of storing the eighth signal, and the fourth circuit has a function of generating a ninth signal by performing an operation on the eighth signal and the sixth signal. The multiplication term of the first signal by the weight potential is output to the ninth signal. The fourth circuit has a function of determining the ninth signal, and the fourth circuit outputs a determination result through the neural network interface.

The imaging device with the above structure and the following characteristics is preferable. The imaging device further includes an analog/digital converter circuit (15), a signal line Pio, and a wiring VRS. The pixel has a function of outputting first data to the analog/digital converter circuit through the signal line Pio. The pixel has a function of receiving, through the signal line Pio, a first potential supplied to the wiring VRS. The pixel functions as a neural network neuron when the first potential supplied to the wiring VRS is input to the pixel through the signal line Pio.

The imaging device with the above structure and the following configuration characteristics is preferable. The imaging device further includes a wiring VPD, a wiring VDM, a signal line G1, a signal line G2, a signal line G3, a signal line Tx, a signal line Res, a signal line S1, and a signal line S2. The pixel includes a photoelectric conversion element (50), a first transistor (21), a second transistor (22), a third transistor (23), a fourth transistor (24), a fifth transistor (25), a sixth transistor (26), a seventh transistor (27), a first capacitor (C1), a second capacitor (C2), and a third capacitor (C3). The first circuit (11) is electrically connected to the pixel through the signal line G1; the first circuit is electrically connected to the pixel through the signal line G2; and the first circuit is electrically connected to the pixel through the signal line G3. The second circuit (12) is electrically connected to the pixel through the signal line S1, and the second circuit is electrically connected to the pixel through the signal line S2. One electrode of the photoelectric conversion element is electrically connected to the wiring VPD, and the other electrode of the photoelectric conversion element is electrically connected to one of a source and a drain of the first transistor. A gate of the first transistor is electrically connected the signal line Tx, and the other of the source and the drain of the first transistor is electrically connected to one of a source and a drain of the second transistor, a gate of the third transistor, and one electrode of the first capacitor. The other of the source and the drain of the second transistor is electrically connected to the wiring VRS, and a gate of the second transistor is electrically connected to the signal line Res. One of a source and a drain of the third transistor is electrically connected to the wiring VDM, and the other of the source and the drain of the third transistor is electrically connected to one of a source and a drain of the fourth transistor and one electrode of the second capacitor. The other of the source and the drain of the fourth transistor is electrically connected to the wiring Pio, and a gate of the fourth transistor is electrically connected to the signal line G3. The other electrode of the second capacitor is electrically connected to a gate of the fifth transistor, one of a source and a drain of the sixth transistor, and one electrode of the third capacitor. One of a source and a drain of the fifth transistor is electrically connected to the first signal line Wx. The other of the source and the drain of the sixth transistor is electrically connected to the signal line S1, and a gate of the sixth transistor is electrically connected to the signal line G1. The other electrode of the third capacitor is electrically connected to one of a source and a drain of the seventh transistor. The other of the source and the drain of the seventh transistor is electrically connected to the signal line S2, and a gate of the seventh transistor is electrically connected to the signal line G2.

The imaging device with the above structure and the following characteristics is preferable. The imaging device further includes a signal line Csw, a signal line Cswb, a signal line Eabs, a signal line Osp, a signal line Ewx, a signal line Mac, and a wiring VIV. The third circuit includes a current mirror circuit, a memory circuit, and an output circuit. The current mirror circuit includes an eighth transistor (31), a ninth transistor (32), a tenth transistor (33), an eleventh transistor (34), and a twelfth transistor (35). The memory circuit includes a thirteenth transistor (36), a fourteenth transistor (37), a fifteenth transistor (38), and a fourth capacitor (C4). The output circuit includes a sixteenth transistor (39) and a resistor R1. The wiring VDM is electrically connected to one of a source and a drain of the eighth transistor (31) and one of a source and a drain of the ninth transistor (32). A gate of the eighth transistor (31) is electrically connected to a gate of the ninth transistor (32), one of a source and a drain of the tenth transistor (33), and one of a source and a drain of the eleventh transistor (34). The other of the source and the drain of the eighth transistor (31) is electrically connected to the other of the source and the drain of the tenth transistor (33) and one of a source and a drain of the twelfth transistor (35). A gate of the tenth transistor (33) is electrically connected to the signal line Cswb; a gate of the eleventh transistor (34) is electrically connected to the signal line Csw; and a gate of the twelfth transistor (35) is electrically connected to the signal line Eabs. The other of the source and the drain of the twelfth transistor (35) is electrically connected to the first signal line Wx and one of a source and a drain of the sixteenth transistor (36). The other of the source and the drain of the ninth (32) transistor is electrically connected to the other of the source and the drain of the eleventh transistor (34), one of a source and a drain of the thirteenth transistor (36), and one of the fourteenth transistor (37). A gate of the fourteenth transistor (37) is electrically connected to the signal line Osp, and the other of the source and the drain of the fourteenth transistor (37) is electrically connected to one of a source and a drain of the fifteenth transistor (38), one electrode of the fourth capacitor (C4), and a gate of the thirteenth transistor (36). A gate of the fifteenth transistor (38) is electrically connected to the signal line Res. The other of the source and the drain of the sixteenth transistor (39) is electrically connected to one electrode of the resistor R1 and the signal line Mac, and a gate of the sixteenth transistor (39) is electrically connected to the signal line Ewx. The other electrode of the resistor R1 is electrically connected to the wiring VIV.

The imaging device with the above structure and the following characteristics is preferable. The imaging device further includes a signal line Sh, a signal line CL, a signal line Out, a wiring VCDS, and a wiring JD. The fourth circuit includes a CDS circuit and a determination circuit. The CDS circuit includes a fifth capacitor (C5), a sixth capacitor (C6), an operational amplifier OP1, and a seventeenth transistor (41). The determination circuit includes a seventh capacitor (C7), an operational amplifier OP2, and an eighteenth transistor (41). The signal line Mac is electrically connected one electrode of the fifth capacitor (C5). A first input terminal of the operational amplifier OP1 is electrically connected to the other electrode of the fifth capacitor (C5), one electrode of the sixth capacitor (C6), and one of a source and a drain of the seventeenth transistor (41). A gate of the seventeenth (41) transistor is electrically connected to the signal line CL. A second input terminal of the operational amplifier OP1 is electrically connected to the wiring VCDS, and an output terminal of the operational amplifier OP1 is electrically connected to the other electrode of the sixth capacitor (C6), the other of the source and the drain of the seventeenth transistor (41), and one of a source and a drain of the eighteenth transistor (42). A gate of the eighteenth transistor is electrically connected to the signal line Sh, and the other of the source and the drain of the eighteenth transistor is electrically connected to a first input terminal of the operational amplifier OP2 and one electrode of the seventh capacitor (C7). A second input terminal of the operational amplifier OP2 is electrically connected to the wiring JD, and an output terminal of the operational amplifier OP2 is electrically connected to the signal line Out. The signal line Out is connected to a neural network.

The imaging device with the above structure and the following characteristics is preferable. The imaging device further includes a second signal line Wx, a signal line Bsel1, and a switch Bsw. The switch Bsw has a function of electrically connecting the first signal line Wx and the second signal line Wx in response to a signal supplied to the wiring Bsel. The third circuit has a function of receiving a plurality of the fifth signals, a plurality of the sixth signals, and a plurality of the seventh signals from a plurality of pixels connected to the first signal line Wx and a plurality of pixels connected to the second signal line Wx. The third circuit has a function of adding the fifth signal, the sixth signal, and the seventh signal supplied from each of the pixels and then subtracting the first offset term. The imaging device has a function of selecting a selection range of a plurality of pixels in response to a signal supplied to the switch Bsw. Pooling processing is performed in the imaging device in accordance with the selection range of the pixels.

In the imaging device with the above structure, the photoelectric conversion element preferably includes selenium or a compound containing selenium.

In the imaging device with the above structure, any one or more of the first transistor (21), the second transistor (22), the fourth transistor (24), the sixth transistor (26), and the seventh transistor (27) preferably include a metal oxide in a channel formation region.

The imaging device with the above structure is preferably characterized in that the thirteenth transistor (36) has the same channel length and channel width as the fifth transistor (25).

The imaging device with the above structure is preferably characterized in that a second voltage supplied to the wiring VIV is smaller than a third voltage supplied to the wiring VDM.

In the imaging device with the above structure, the metal oxide preferably includes In, Zn, and M (M is Al, Ti, Ga, Sn, Y, Zr, La, Ce, Nd, or Hf).

An electronic device including any one of the above-described imaging devices and a display device is preferable.

Effect of the Invention

In view of the above problems, one embodiment of the present invention can provide an imaging device with a novel structure. Another embodiment of the present invention can provide an imaging device having a pooling layer of a neural network. Another embodiment of the present invention can provide an imaging device with a novel structure that can shorten processing time by reducing the amount of operations. Another embodiment of the present invention can provide an imaging device with a novel structure that can reduce power consumption.

Note that the effects of one embodiment of the present invention are not limited to the effects listed above. The effects listed above do not preclude the existence of other effects. The other effects are the effects that are not described in this section and will be described below. Effects that are not described in this section will be apparent from the description of the specification, the drawings, and the like and can be derived from the description by those skilled in the art. One embodiment of the present invention is to have at least one effect of the effects listed above and/or the other effects. Therefore, one embodiment of the present invention does not have the effects listed above in some cases.

BRIEF DESCRIPTION OF DRAWINGS

FIG. 12 Perspective views of a package and a module each storing an imaging device.

MODE FOR CARRYING OUT THE INVENTION

Embodiment 1

Figure 1:
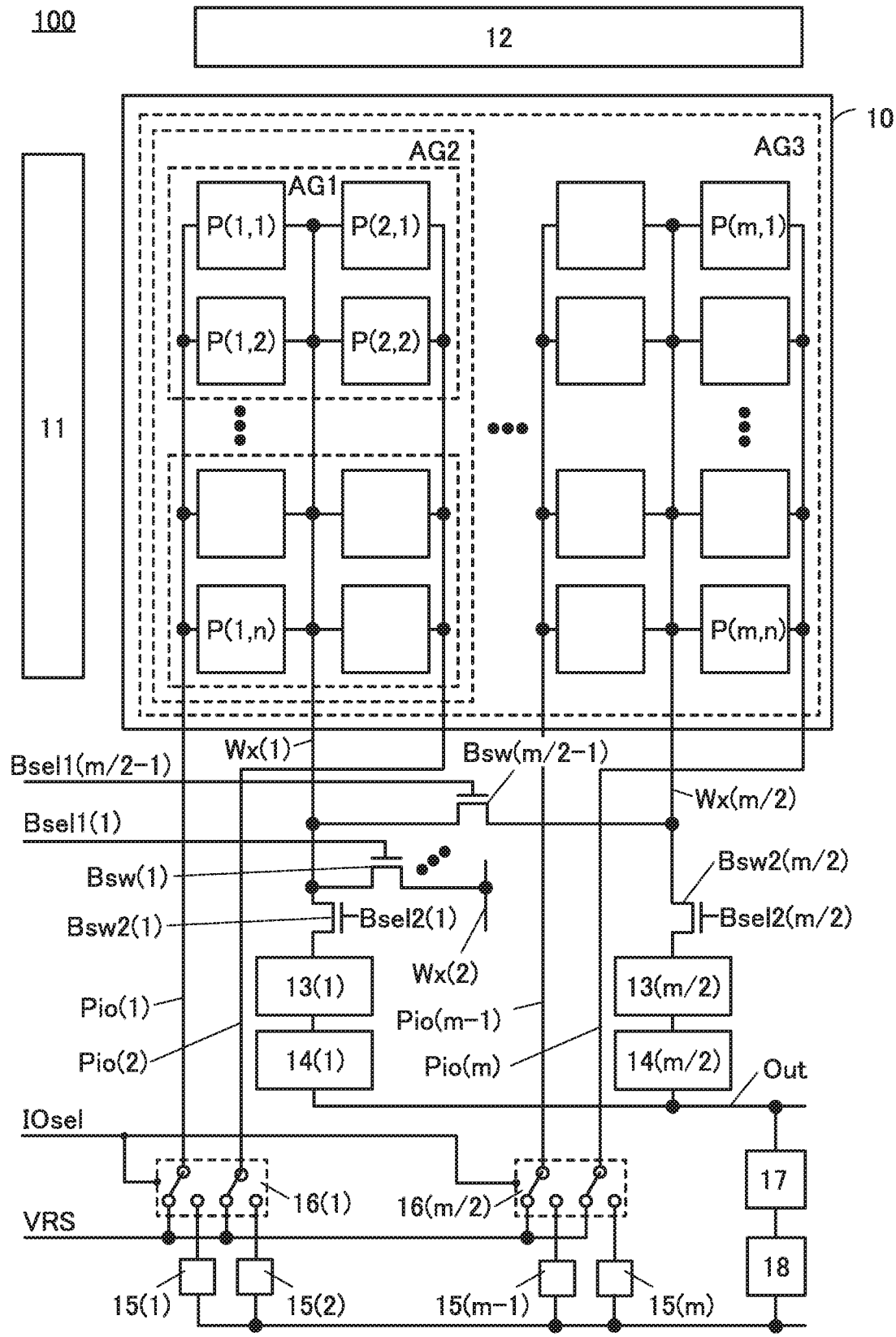
FIG. 1 A block diagram illustrating an imaging device.

In this embodiment, an imaging device in which an offset component generated when multiplication is performed with a transistor is reduced will be described with reference to FIG. 1 to FIG. 6.

First, a block diagram of an imaging device 100 is described with reference to FIG. 1. The imaging device 100 is connected to a neural network 17 and a processor 18. The imaging device 100 outputs data to the neural network 17 through a neural network interface and outputs imaging data to the processor 18. The processor 18 can control the imaging device 100 and the neural network.

The imaging device 100 includes a pixel region 10, a circuit 11, a circuit 12, a circuit 13(1) to a circuit 13(m/2), a circuit 14(1) to a circuit 14(m/2), an analog/digital converter circuit 15(1) to an analog/digital converter circuit 15(m), and a switch module 16(1) to a switch module (m/2). When no coordinates are specified, the circuit 13, the circuit 14, the analog/digital converter circuit 15, and the switch module 16 are used as the terms for explanation. Note that m and n are each a positive integer greater than or equal to 1.

The imaging device 100 includes a signal line Pio(1) to a signal line Pio(m), a first signal line Wx to a signal line Wx(m/2), a signal line Out, a signal line IOsel, a wiring VRS, a plurality of switches Bsw, a plurality of switches Bsw2, and a plurality of signal lines Bsel1. Furthermore, although not illustrated in FIG. 1, the imaging device 100 includes a signal line G1(1) to a signal line G1(n), a signal line G2(1) to a signal line G2(n), a signal line G3(1) to a signal line G3(n), a signal line S1(1) to a signal line S1(m), and a signal line S2(1) to a signal line S2(m).

The display region 10 includes a pixel P(1, 1) to a pixel P(m, n). The pixel region 10 can group pixels P in a given selected area. The selected area can be determined by the switch Bsw, the switch Bsw2, the signal line Bsel1, and a signal line Bsel2. Therefore, the switch Bsw, the switch Bsw2, the signal line Bsel1, and the signal line Bsel2 are preferably arranged depending on the selected areas. Hereafter, the description is made with regard to the pixel P or the pixel P(i, j) in the i-th column and the j-th row of the pixel region when no pixel coordinates are specified. Note that i is a positive integer less than or equal to m, and j is a positive integer less than or equal to n.

In FIG. 1, an area AG1, an area AG2, and an area AG3 show selectable areas with different numbers of pixels. However, the selectable areas are not limited to the above; it is preferable that pixels in various areas are selectable as the selectable areas. The selectable areas serve as selected areas for pooling processing in the neural network. Pooling processing with different selected areas can reduce the amount of operations and facilitates acquisition of features by the neural network. Thus, the imaging device 100 can reduce the amount of operations by the neural network and decrease the power consumption and the processing time by outputting image data subjected to pooling processing to the neural network.

Although not illustrated in FIG. 1, the circuit 11 is electrically connected to pixels arranged in a column direction through the signal line G1; the circuit 11 is electrically connected to the pixels arranged in the column direction through the signal line G2; and the circuit 11 is electrically connected to the pixels arranged in the column direction through the signal line G3. The circuit 12 is electrically connected to pixels arranged in a row direction through the signal line S1, and the circuit 12 is electrically connected to the pixels arranged in the row direction through the signal line S2.

As an example, in the area AG2, the pixel P(1, 1) to the pixel P(2, n) are electrically connected to the circuit 13(1) through the first signal line Wx and the circuit 13(1) is electrically connected to the circuit 14(1). An output of the circuit 14(1) is electrically connected to the neural network through the signal line Out.

The circuit 11 has a function of supplying a scan signal to the pixel P(i, j) through the signal line G1(U) to the signal line G3(0), and the circuit 12 can supply an offset potential W and a weight potential w(i, j) to the pixel P(i, j) selected by the scan signal.

The pixel P(i, j) can acquire a first signal by photoelectric conversion with use of light. Furthermore, the pixel P(i, j) can generate a second signal by adding the offset potential to the first signal. The pixel P(i, j) can generate a third signal by adding the weight potential to the offset potential. Furthermore, the pixel P(i, j) can generate a fourth signal by adding the offset potential and the weight potential to the first signal.

The pixel P(i, j) can generate a fifth signal by multiplying the second signal at a predetermined magnification. The pixel P(i, j) can generate a sixth signal by multiplying the third signal at a predetermined magnification. The pixel P(i, j) can generate a seventh signal by multiplying the fourth signal at a predetermined magnification.

The circuit 13 can store the second signal. Furthermore, the circuit 13 can generate an eighth signal by performing an operation on the seventh signal and the fifth signal.

The circuit 14 can store the eighth signal. Furthermore, the circuit 14 can generate a ninth signal by performing an operation on the eighth signal and the sixth signal. A multiplication term of the first signal by the weight potential is output to the ninth signal. Thus, the circuit 14 can output a determination result of the ninth signal to the neural network. That is, the circuit 14 has a function as the neural network interface.

As an example, the pixel P(1, 1) is electrically connected to the switch module 16(1) through the signal line Pio(1) in FIG. 1. The switch module (1) can connect the signal line Pio(1) to either the analog/digital converter circuit 15(1) or the wiring VRS in response to a signal supplied to the signal line IOsel. The pixel P(1, 1) functions as an imaging element by supplying first data to the analog/digital converter circuit 15(1) through the signal line Pio. The pixel P(1, 1) functions as a neuron of the neural network when a reset potential supplied to the wiring VRS is input to the pixel P(1, 1) through the signal line Pio(1).

The pixel P(i, j), the circuit 13, and the circuit 14 are described in detail with reference to the circuit diagram of FIG. 2.

The imaging device 100 further includes a signal line Tx, a signal line Res, a signal line Csw, a signal line Cswb, a signal line Eabs, a signal line Osp, a signal line Ewx, a signal line Mac, a signal line Sh, a signal line CL, the signal line Out, a wiring VPD, a wiring VDM, the wiring VRS, a wiring VIV, a wiring VCDS, a wiring JD, and a wiring GND.

The pixel P(i, j) includes a photoelectric conversion element 50, a transistor 21, a transistor 22, a transistor 23, a transistor 24, a transistor 25, a transistor 26, a transistor 27, a capacitor C1, a capacitor C2, a capacitor C3, a node FN1, a node FN2, and a node FN3.

One electrode of the photoelectric conversion element 50 is electrically connected to the wiring VPD, and the other electrode of the photoelectric conversion element 50 is electrically connected to one of a source and a drain of the transistor 21. A gate of the transistor 21 is electrically connected to the signal line Tx.

The other of the source and the drain of the transistor 21 is electrically connected to one of a source and a drain of the transistor 22, a gate of the transistor 23, and one electrode of the capacitor C1. The other of the source and the drain of the transistor 22 is electrically connected to the wiring VRS, and the gate of the transistor 22 is electrically connected to the signal line Res. One of a source and a drain of the transistor 23 is electrically connected to the wiring VDM, and the other of the source and the drain of the transistor 23 is electrically connected to one of a source and a drain of the transistor 24 and one electrode of the capacitor C2. The other of the source and the drain of the transistor 24 is electrically connected to the wiring Pio(i), and a gate of the transistor 24 is electrically connected to the signal line G3.

The other electrode of the capacitor C2 is electrically connected to a gate of the transistor 25, one of a source and a drain of the transistor 26, and one electrode of the capacitor C3. One of a source and a drain of the transistor 25 is electrically connected to the signal line Wx. The other of the source and the drain of the transistor 25 is electrically connected to the wiring GND.

The other of the source and the drain of the transistor 26 is electrically connected to the signal line S1(i), and a gate of the transistor 26 is electrically connected to the signal line G10(j). The other electrode of the capacitor C3 is electrically connected to one of a source and a drain of the transistor 27. The other of the source and the drain of the transistor 27 is electrically connected to the signal line S2(i), and a gate of the transistor 27 is electrically connected to the signal line G2(i).

The node FN1 is formed by the connection of the other of the source and the drain of the transistor 21, the one of the source and the drain of the transistor 22, the gate of the transistor 23, and the one electrode of the capacitor C1. The node FN2 is formed by the connection of the other of the source and the drain of the transistor 23, the one of the source and the drain of the transistor 24, and the one electrode of the capacitor C2. The node FN3 is formed by the connection of the other electrode of the capacitor C2, the gate of the transistor 25, the one of the source and the drain of the transistor 26, and the one electrode of the capacitor C3.

The circuit 13 includes a current mirror circuit, a memory circuit, and an output circuit; the current mirror circuit includes a transistor 31, a transistor 32, a transistor 33, a transistor 34, and a transistor 35.

The memory circuit includes a transistor 36, a transistor 37, a transistor 38, and a capacitor C4.

The output circuit includes a transistor 39 and a resistor R1.

The wiring VDM is electrically connected to one of a source and a drain of the transistor 31 and one of a source and a drain of the transistor 32. A gate of the transistor 31 is electrically connected to a gate of the transistor 32, one of a source and a drain of the transistor 33, and one of a source and a drain of the transistor 34. The other of the source and the drain of the transistor 31 is electrically connected to the other of the source and the drain of the transistor 33 and one of a source and a drain of the transistor 35.

A gate of the transistor 33 is electrically connected to the signal line Cswb, a gate of the transistor 34 is electrically connected to the signal line Csw, and a gate of the transistor 35 is electrically connected to the signal line Eabs. The other of the source and the drain of the transistor 35 is electrically connected to the signal line Wx and one of a source and a drain of the transistor 39.

The other of the source and the drain of the transistor 32 is electrically connected to the other of the source and the drain of the transistor 34, one of a source and a drain of the transistor 36, and one of the transistor 37. The other of the source and the drain of the transistor 36 is electrically connected to the wiring GND.

A gate of the transistor 37 is electrically connected to the signal line Osp. The other of the source and the drain of the transistor 37 is electrically connected to one of a source and a drain of the transistor 38, one electrode of the capacitor C4, and a gate of the transistor 36. A gate of the transistor 38 is electrically connected to the signal line Res. The other of the source and the drain of the transistor 38 is electrically connected to the other electrode of the capacitor C4 and the wiring GND.

The other of the source and the drain of the transistor 39 is electrically connected to one electrode of the resistor R1 and the signal line Mac, and a gate of the transistor 39 is electrically connected to the signal line Ewx. The other electrode of the resistor R1 is electrically connected to the wiring VIV.

The circuit 14 includes a CDS circuit and a determination circuit.

The CDS circuit includes a capacitor C5, a capacitor C6, an operational amplifier OP1, and a transistor 41.

The determination circuit includes a capacitor C6, an operational amplifier OP2, and a transistor 42.

The signal line Mac is electrically connected to one electrode of the capacitor C5. A first input terminal of the operational amplifier OP1 is electrically connected to the other electrode of the capacitor C5, one electrode of the capacitor C6, and one of a source and a drain of the transistor 41. A gate of the transistor 41 is electrically connected to the signal line CL. A second input terminal of the operational amplifier OP1 is electrically connected to the wiring VCDS, and an output terminal of the operational amplifier OP1 is electrically connected to the other electrode of the capacitor C6, the other of the source and the drain of the transistor 41, and one of a source and a drain of the transistor 42.

A gate of the transistor 42 is electrically connected to the signal line Sh. The other of the source and the drain of the transistor 42 is electrically connected to a first input terminal of the operational amplifier OP2 and one electrode of the capacitor C7. A second input terminal of the operational amplifier OP2 is electrically connected to the wiring JD. The output terminal of the operational amplifier OP1 is electrically connected to the signal line Out, and the signal line Out is connected to the neural network.

The pixel P(i, j) preferably has two functions. The first function is a function as an imaging element. The second function is a function as a neuron that multiplies imaging data by a weight coefficient. The weight coefficient is preferably supplied in the form of voltage as a weight potential.

When the pixel P(i, j) functions as an imaging element, imaging data vi(i, j) is output to the signal line Pio(i) through the transistor 24. The imaging data vi(i, j) is supplied to the analog/digital converter circuit 15(i) through the switch module 16(i/2), and the analog/digital converter circuit (i) can output the digitized imaging data vi(i, j) to the processor 18.

First, the case where the pixel P(i, j) functions as an image element is described in detail. A potential as power for the photoelectrical conversion element 50 is supplied to the wiring VPD, and a reset potential for resetting the node FN1 through the transistor 22 is supplied to the wiring VRS. The transistor 21 is brought into an on state in response to a signal supplied to the signal line Tx, and a photocurrent generated by photoelectric conversion with the photoelectric conversion element 50 can be supplied to the capacitor C1. The photocurrent supplied to the capacitor C1 is converted into a voltage by the capacitor C1, whereby the node FN1 is updated. A voltage lower than the potential of the node FN1 by the threshold voltage $V_{th23}$ of the transistor 23 is supplied to the node FN2 as the imaging data vi(i, j). The imaging data vi(i, j) is output to the signal line Pio(i) through the transistor 24 and is supplied to the analog/digital converter circuit 15(i) through the signal line Pio(i). The imaging data vi(i, j) corresponds to the first signal.

Next, the case where the pixel P(i, j), the circuit 13, and the circuit 14 function as a neuron is described. The pixel P(i, j) can have a multiplication function of a product-sum operation function of the neuron. In the pixel P(i, j), multiplication with a transistor can be performed by controlling the node FN3 with the capacitor C2, the capacitor C3, and the transistor 25 to the transistor 27. That is, the pixel P(i, j) can acquire a multiplication result by regarding a change in the potential of the node FN3 as a change in the drain current of the transistor 25.

First, the case where the pixel P(i, j) functions as a neuron will be described in detail. The drain current $I_d$ of the transistor 25 can be represented by Equation (1).

[Formula 1]

$$I_d = \frac{\beta}{2}(V_{gs} - V_{th})^2 \quad (1)$$

Here, the variable β can be represented by Equation (2). The equation indicates that the variable β is a variable that the transistor 25 has.

[Formula 2]

$$\beta = \mu C_{ox} \frac{W}{L}. \quad (2)$$

In the case where the transistor 25 is used for multiplication, the node FN3 is supplied with the weight potential w(i, j) from the signal line S1(i) through the transistor 26. At this time, it is preferable that the node FN2 have the imaging data vi(i, j) that is obtained when a reset potential supplied to the wiring VRS is supplied to the node FN1 through the transistor 22.

Next, the imaging data vi(i, j) generated by the photoelectric conversion element 50 is supplied to the node FN2. Thus, the potential $V_{gs}$ of the transistor 25 becomes the value in which the imaging data vi(i, j) is added through the capacitor C2 to the weight potential w(i, j) stored in the node FN3. Accordingly, the drain current $I_d$ of the transistor 25 is represented by Equation (3). Note that the threshold voltage $V_{th}$ in Equation (3) is the threshold voltage of the transistor 25.

[Formula 3]

$$I_d = \frac{\beta}{2}(w(i, j) + Av(i, j) - V_{th})^2 \quad (3)$$

The potential of the node FN3 is converted with use of the capacity ratio A of the capacitor C2 to the capacitor C3 to the gate capacitance of the transistor 25. Note that the capacity ratio A is set to 1 in the description for simplification of the explanation about calculation equations. To accurately calculate the capacity ratio A, it is preferable that not only the gate capacitance of the transistor 25 but also the capacitance of the capacitor C2, the capacitance of the capacitor C3, the capacitance formed between the one of the source and the drain of the transistor 26 and the gate of the transistor 26, the parasitic capacitance, and the like be taken into account. The drain current $I_d$ can be represented by Equation (3.1) assuming that A is 1.

[Formula 4]

$$I_d = \frac{\beta}{2}\{(w(i, j) + v(i, j)) - V_{th}\}^2 \quad (3.1)$$

Equation (4) can be obtained by developing and rearranging Equation (3.1). Upon the rearrangement, Equation 4 has a multiplication term of the imaging data by the weight potential obtained with use of the transistor 25 and an offset term A1 (Equation (4.1)) other than the multiplication term.

[Formula 5]

$$I_d = \beta w(i, j)v(i, j) + A1 \quad (4)$$

$$A1 = \frac{\beta}{2}\{(w(i, j)^2 + v(i, j)^2) - 2w(i, j)V_{th} - 2v(i, j)V_{th} + V_{th}^2\} \quad (4.1)$$

As indicated by Equation (4), the influence of the offset term A1 is preferably reduced in multiplication using the transistor 25. Thus, the offset term A1 is preferably reduced with a circuit. Accordingly, to reduce the offset term A1, an offset term A2 shown in Equation (5.1) depending on the imaging data vi(i, j) and an offset term A3 shown in Equation (5.2) depending on the weight potential are preferably subtracted from Equation (3.1), as shown in Equation (5).

[Formula 6]

$$I_d = \frac{\beta}{2}(w(i, j) + v(i, j) - V_{th})^2 - A2 - A3 \quad (5)$$

$$A2 = \frac{\beta}{2}(v(i, j) - V_{th})^2 \quad (5.1)$$

$$A3 = \frac{\beta}{2}(w(i, j) - V_{th})^2 \quad (5.2)$$

Equation (5.3) can be obtained by developing Equation (5).

[Formula 7]

$$I_d = \beta w(i, j)v(i, j) + \\ \frac{\beta}{2}\{(w(i, j)^2 + v(i, j)^2) - 2w(i, j)V_{th} - 2v(i, j)V_{th} + V_{th}^2\} - \\ \frac{\beta}{2}(v(i, j)^2 - 2v(i, j)V_{th} + V_{th}^2) - \frac{\beta}{2}(w(i, j)^2 - 2w(i, j)V_{th} + V_{th}^2) \quad (5.3)$$

Equation (6) can be obtained by rearranging the terms. As shown, when the offset term A2 and the offset term A3 are subtracted from Equation 3.1, the offset term A1 can be decreased to a value that can be expressed only with the threshold voltage $V_{th}$ of the transistor 25.

[Formula 8]

$$I_d = \beta w(i, j)v(i, j) - \frac{\beta}{2}V_{th}^2 \quad (6)$$

Here, the weight potential w(i, j) is supplementarily explained. The weight potential w(i, j) can also be referred to as a weight coefficient. The weight coefficient can be a positive value or a negative value. However, it is preferable that the weight potential w(i, j) be a positive potential even when the weight coefficient is a negative value. Therefore, an offset potential W is preferably added to the weight potential w(i, j) so that the weight potential w(i, j) becomes a positive potential even when the weight coefficient is a negative value. Thus, in Equation (5.4), the offset potential W is added to each term of Equation (5).

[Formula 9]

$$I_d = \frac{\beta}{2}(w(i, j) + v(i, j) + W - V_{th})^2 - \\ \frac{\beta}{2}(Av(i, j) + W - V_{th})^2 - \frac{\beta}{2}(w(i, j) + W - V_{th})^2 \quad (5.4)$$

Equation (7) is obtained by developing and rearranging Equation (5.4). As shown, the offset component of the offset term A1 can be decreased to a level expressed with the offset potential W and the threshold voltage $V_{th}$ of the transistor 25.

[Formula 10]

$$I_d = \beta w(i, j)v(i, j) - \frac{\beta}{2}(W - V_{th})^2 \quad (7)$$

It is difficult to subtract the offset components represented by Equation (5.1) and Equation (5.2) with use of the pixel P(i, j), and thus it is preferable that the offset components be subtracted with use of the circuit 13 and the circuit 14. The circuit 13 can subtract the offset term A2 represented by Equation (5.1) that depends on the imaging data vi(i, j) and the circuit 14 can subtract the offset term A3 represented by Equation (5.2) that depends on the weight potential w(i, j).

Next, a method for subtracting the offset components represented by Equation (5.1) and Equation (5.2) is described with reference to FIG. 2. The offset potential W is supplied to the node FN3 from the signal line S1(i) through the transistor 26. The offset potential W is supplied to the other electrode of the capacitor C3 from the signal line S2(i) through the transistor 27. Thus, the same offset potential W is supplied to both electrodes of the capacitor C3. The reset potential supplied to the wiring VRS is supplied to the node FN2 through the transistor 24. The node FN1 is preferably supplied with the reset potential through the transistor 22 in response to a signal supplied to the signal line Res. A potential supplied to the wiring GND is supplied to the capacitor C4 through the transistor 38 in response to the signal supplied to the signal line Res. The reset potential may be equal to the potential supplied to the wiring VRS or be a reference potential of the imaging device 100. The potential supplied to the wiring GND may be equal to the reference potential of the imaging device 100.

In the circuit 14, when the transistor 41 is brought into an on state in response to a signal supplied to the signal line CL, the operational amplifier OP1 forms a voltage follower. Thus, a potential supplied to the wiring VCDS connected to the second input terminal of the operational amplifier OP1 is output to the output terminal of the operational amplifier OP1. Accordingly, a node Cdsin connected to the first input terminal of the operational amplifier OP1 is supplied, through the transistor 41, with the potential supplied to the wiring VCDS. That is, the capacitor C6 is reset by the potential supplied to the wiring VCDS. The transistor 42 is brought into an on state in response to a signal supplied to the signal line Sh, and the first input terminal of the operational amplifier OP2 is supplied with the potential that is supplied to the wiring VCDS and output to the output terminal of the operational amplifier OP1. The capacitor C7 is reset by the potential supplied to the wiring VCDS.

Next, the imaging data vi(i, j) generated by the photoelectric conversion element is supplied to the node FN2. Thus, $V_{gs}$ of the transistor 25 becomes a voltage in which the imaging data vi(i, j) output to the node FN2 is added through the capacitor C2 to the potential W stored in the node FN3. That is, the second signal is generated by adding the offset potential W to the imaging data vi(i, j).

A multiplication result obtained using the second signal supplied to the gate of the transistor 25 is supplied to the signal line Wx as a drain current. At this time, the signal supplied to the signal line Wx can be the fifth signal.

Furthermore, the transistor 33, the transistor 35, and the transistor 37 are brought into an on state in response to signals supplied to the signal line Eabs, the signal line Cswb, and the signal line Osp. The transistor 33 and the transistor 35 are in an on-state, whereby the transistor 31, the transistor 32, and the transistor 33 form a current mirror circuit. The fifth signal flowing through the transistor 31 is copied by the transistor 32 and supplied to the capacitor C4 through the transistor 37. The transistor 36 is preferably a transistor having the same channel length and channel width as the transistor 25. When the transistor 36 carries a current as large as that flowing through the transistor 25, the node FN4 can store the second signal equal to that in the node FN3.

Next, the transistor 33 and the transistor 37 are brought into an off state. Then, the weight potential w(i, j) is supplied to the other electrode of the capacitor C3 through the transistor 27. The fourth signal in which the weight potential w(i, j) is added to the second signal is generated in the node FN3. A multiplication result obtained using the signal supplied to the gate of the transistor 25 is supplied to the signal line Wx as a drain current. At this time, the signal supplied to the signal line Wx can be the seventh signal.

Furthermore, the transistor 34, the transistor 35, and the transistor 39 are brought into an on state in response to signals supplied to the signal line Eabs, the signal line Csw, and the signal line Ewx. The transistor 34 and the transistor 35 are in an on-state, whereby the transistor 31, the transistor 32, and the transistor 34 form a current mirror circuit. The fifth signal flowing through the transistor 32 is copied by the transistor 31, and the fifth signal can be subtracted from the seventh signal flowing in the signal line Wx. Thus, the offset term A2 depending on the imaging data vi(i, j) is subtracted from the seventh signal in the signal line Wx.

The resistor R1 is connected to the signal line Wx through the transistor 39. A current in which the fifth signal is subtracted from the seventh signal is converted into a voltage by the resistor R1, so that the eighth signal is generated. A potential supplied to the wiring VIV is preferably smaller than a power source voltage of the current mirror circuit supplied to the wiring VDM. For example, a potential intermediate between the potential of the wiring VDM and the reference potential GND of the circuit is supplied to the wiring VIV, which is suitable for operations regardless of whether the weight coefficient is a positive value or a negative value.

The eighth signal is supplied to the signal line Mac. The eighth signal supplied to the wiring Mac is supplied to the node Cdsin through the capacitor C5 included in the circuit 14. After that, the transistor 41 is brought into an off state in response to a signal supplied to the signal line CL. The node Cdsin becomes a floating node and thus can store the eighth signal. Furthermore, the transistor 35 is brought into an off state in response to a signal supplied to the signal line Eabs.

Next, the reset potential is supplied to the node FN2 through the transistor 24. The third signal in which the weight potential w(i, j) is added to the offset potential W is generated in the node FN3. A multiplication result obtained using the signal supplied to the gate of the transistor 25 is supplied to the signal line Wx as a drain current. The signal line Mac is supplied with the sixth signal generated by converting the potential of the signal line Wx into a voltage by the resistor R1.

The sixth signal is supplied to the node Cdsin through the capacitor C5. The ninth signal generated by subtracting the sixth signal from the eighth signal is supplied to anode Cdsout connected to the output terminal of the operational amplifier OP1. Thus, in the ninth signal supplied to the node Cdsout, the offset term A3 depending on the weight potential w(i, j) is subtracted from the eighth signal. Therefore, the ninth signal is a multiplication term of the imaging data vi(i, j) by the weight potential w(i, j) as shown in Equation (7), and the offset components can be decreased to the offset term that depends on the offset potential W and the threshold voltage $V_{th}$ of the transistor 25.

The ninth signal is supplied to the first input terminal of the operational amplifier OP2 through the transistor 42. The timing of supplying the ninth signal to the operational amplifier OP2 can be controlled by a signal supplied to the signal line Sh. The second input terminal of the operational amplifier OP2 is supplied with a determination voltage through the wiring JD. A determination result is supplied to the signal line Out from the output terminal of the operational amplifier OP2.

For the transistor 21, the transistor 22, the transistor 24, the transistor 26, and the transistor 27, a transistor with a low off-state current is preferably used. When a transistor with a low off-state current is used for the transistor 21, the transistor 22, and the transistor 24, deterioration of the imaging data stored in the node FN1 and the node FN2 can be inhibited. When the transistor with a low off-state current is used for the transistor 26 and the transistor 27, deterioration of the second signal, the third signal, and the fourth signal stored in the node FN3 can be inhibited. The transistor with a low off-state current will be described in detail in Embodiment 2.

Figure 3:
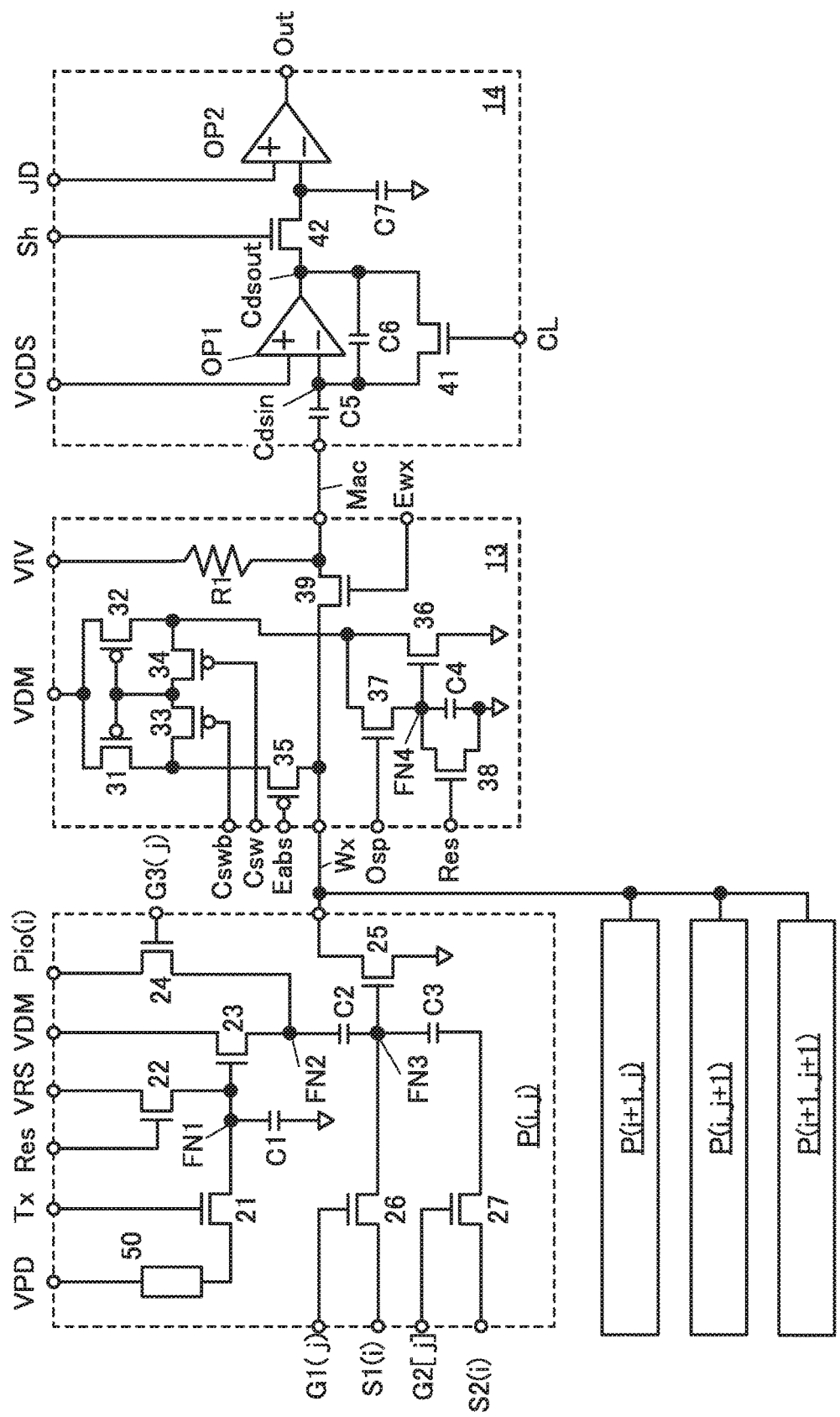
FIG. 3 A circuit diagram illustrating an imaging device.

FIG. 3 illustrates an example in which a plurality of pixels P(i, j) to P(i+1,j+1) are connected to the circuit 13 through the signal line Wx. There is no limitation on the number of pixels P connected to the signal line Wx. A plurality of pixels P included in the area AG selected for pooling processing can be connected to the circuit 13, as shown in FIG. 1.

The pixel P has a function of performing multiplication using the imaging data vi(i, j), the weight potential w(i, j), and the offset potential W. The circuit 13 and the circuit 14 have a function of subtracting the offset terms generated when multiplication is performed in the pixel P. In FIG. 3, the signal line Wx is connected to the plurality of pixels P, thereby having a function of adding outputs from the plurality of pixels P. Therefore, the plurality of pixels P, the circuit 13, and the circuit 14 can have a product-sum operation function that neurons of the neural network have. Accordingly, the product-sum operation performed using the plurality of pixels P, the circuit 13, and the circuit 14 can be represented by Equation (8).

[Formula 11]

$$\sum_{i=9}^{K} I_d = \beta \left\{ \sum_{i=0}^{K} w(i, j) v(i, j) - \sum_{i=0}^{K} \frac{(W - V_{th})^2}{2} \right\} \quad (8)$$

Figure 2:
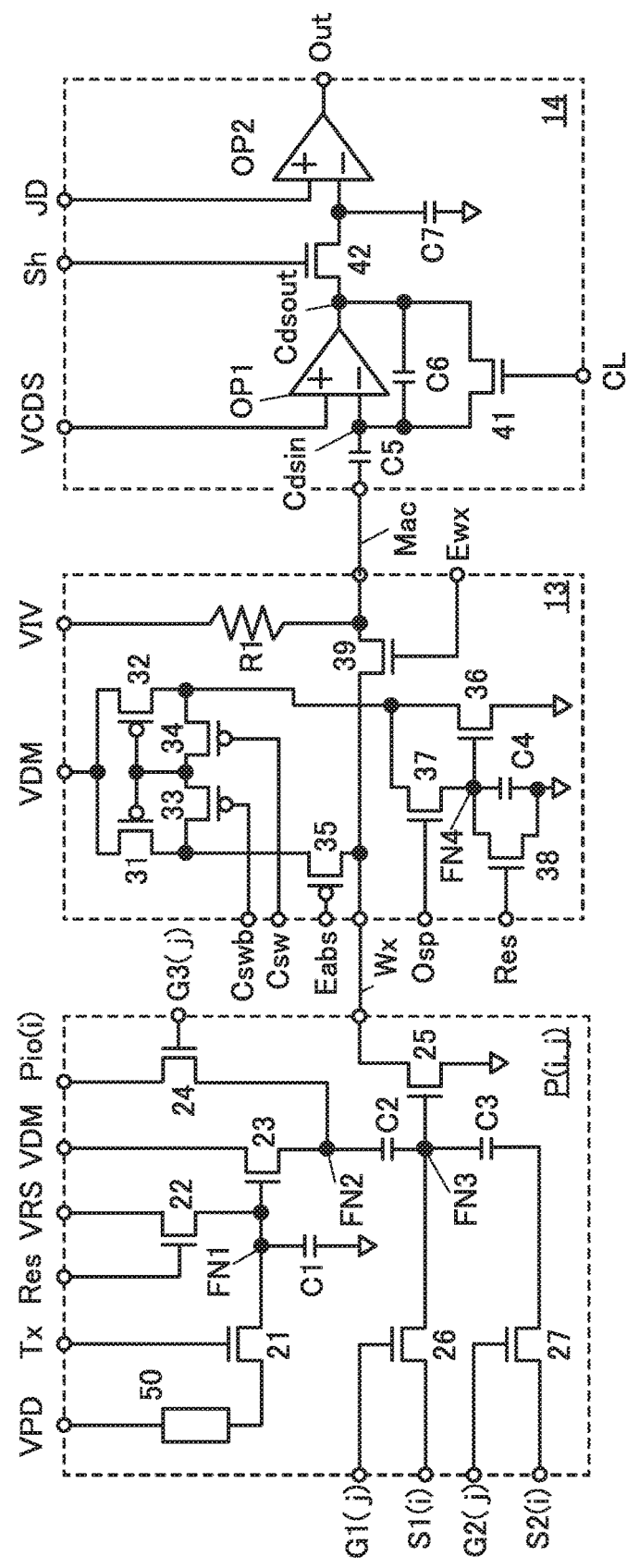
FIG. 2 A circuit diagram illustrating an imaging device.

Next, an operation of the imaging device 100 in FIG. 2 is described with reference to the timing chart of FIG. 4.

In T1, a signal "H" is supplied to the signal line Res, the signal line CL, the signal line Sh, and the signal line G3, so that the reset potential (*1) is supplied to the node FN1, the node FN2, and the node FN4. The node Cdsin and the node Cdsout are each reset by a potential supplied to the wiring VCDS. By supplying the signal "H" to the signal line G1(j) and the signal line G2(0), the offset potential W can be supplied to the node FN3 and the other electrode of the capacitor C3 connected to the node FN3 through the signal line S1(i) and the signal line S2(i).

In T2, the signal "H" is supplied to the signal line Tx, whereby the node FN1 can be updated to imaging data data(i, j) (*2) output from the photoelectric conversion element 50 through the transistor 21. The imaging data vi(i, j) (*3) lower than the imaging data data(i, j) by the threshold voltage $V_{th23}$ of the transistor 23 is supplied to the node FN2. Note that the imaging data vi(i, j) means the first data. The second signal in which the imaging data vi(i, j) is added to the offset potential is stored in the node FN3.

Figure 13:
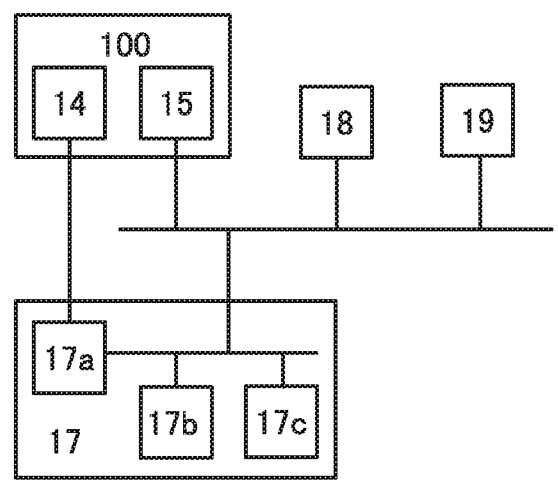
FIG. 13 A block diagram illustrating an electronic device.

In T3, a signal "L" is supplied to the signal line Cswb and the signal line Eabs, whereby the current mirror circuit in FIG. 13 is activated; in addition, the signal "H" is supplied to the signal line Osp, whereby the second signal stored in the node FN 3 can be copied and stored in the node FN4.

In T4, the signal "H" is supplied to the signal line G2, whereby the third signal (*5) in which the weight potential w(i, j) is added to the offset potential W can be supplied to the other electrode of the capacitor C3 through the signal line S2(i). Thus, the fourth signal (*6) in which the weight potential w(i, j) is added to the offset potential and the imaging data vi(i, j) is stored in the node FN3.

In T5, the signal "L" is supplied to the signal line Csw, whereby the fifth signal generated by the transistor 36 can be subtracted from the seventh signal generated by the transistor 25. Furthermore, in T5, the signal "H" is supplied to the signal line Ewx, whereby the eighth signal is generated by the resistor R1 and the eighth signal (*7) supplied to the node Cdsin in the circuit 14 can be supplied.

In T6, the signal "H" is supplied to the signal line Csw and the signal line Eabs, whereby the current mirror circuit in the circuit 13 is deactivated. The signal "L" is supplied to the signal line CL, whereby the eighth signal (*7) can be stored in the node Cdsin. Furthermore, the signal "H" is supplied to the signal line G3(j), whereby the node FN2 is updated to the reset potential. Accordingly, the node FN3 is updated to the third signal (*5) and the ninth signal (*8) is generated in the node Cdsin of the circuit 14.

In T7, the signal "H" is supplied to the signal line Sh, whereby the ninth signal (*8) is determined by a determination voltage supplied to the wiring VD, and the operation amplifier OP2 can supply a determination result Result (*9) to the wiring Out.

Figure 4:
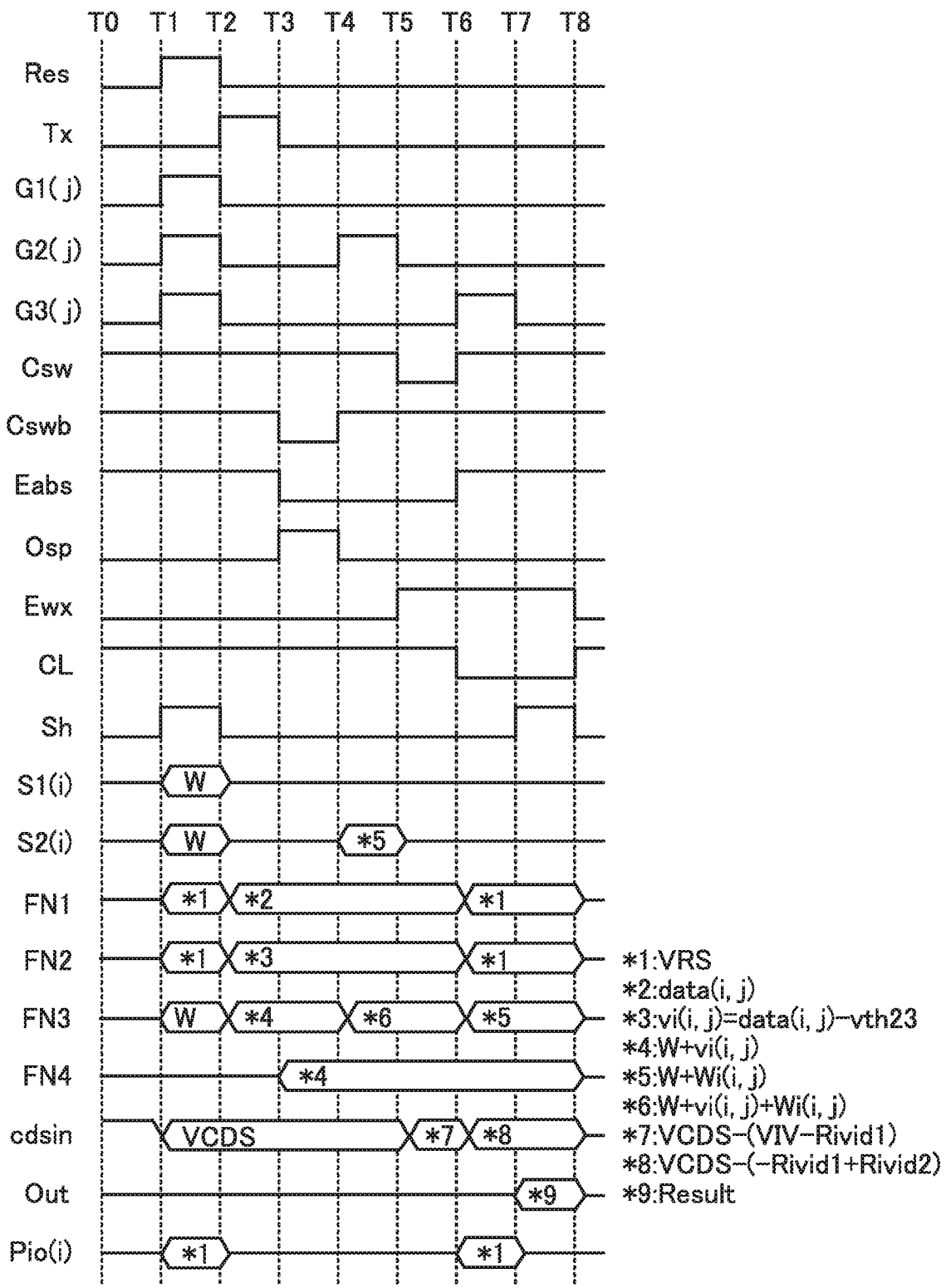
FIG. 4 A timing chart illustrating an operation of an imaging device.

Although the timing chart in FIG. 4 shows the example in which the pixel P(i, j), the circuit 13, and the circuit 14 in FIG. 2 are used, a plurality of pixels P may be used as illustrated in FIG. 3. When pooling processing is performed using the plurality of pixels P, driving timings are preferably adjusted. The imaging device 100 preferably performs the pooling processing with one imaging by a global shutter method. The imaging device 100 has the neural network interface that outputs data after the pooling processing, and thus can reduce the power consumption and the processing time. In addition, the imaging device 100 can reduce the offset terms generated by a multiplication operation with the imaging data vi(i, j) and the weight potential w(i, j).

Figure 5:
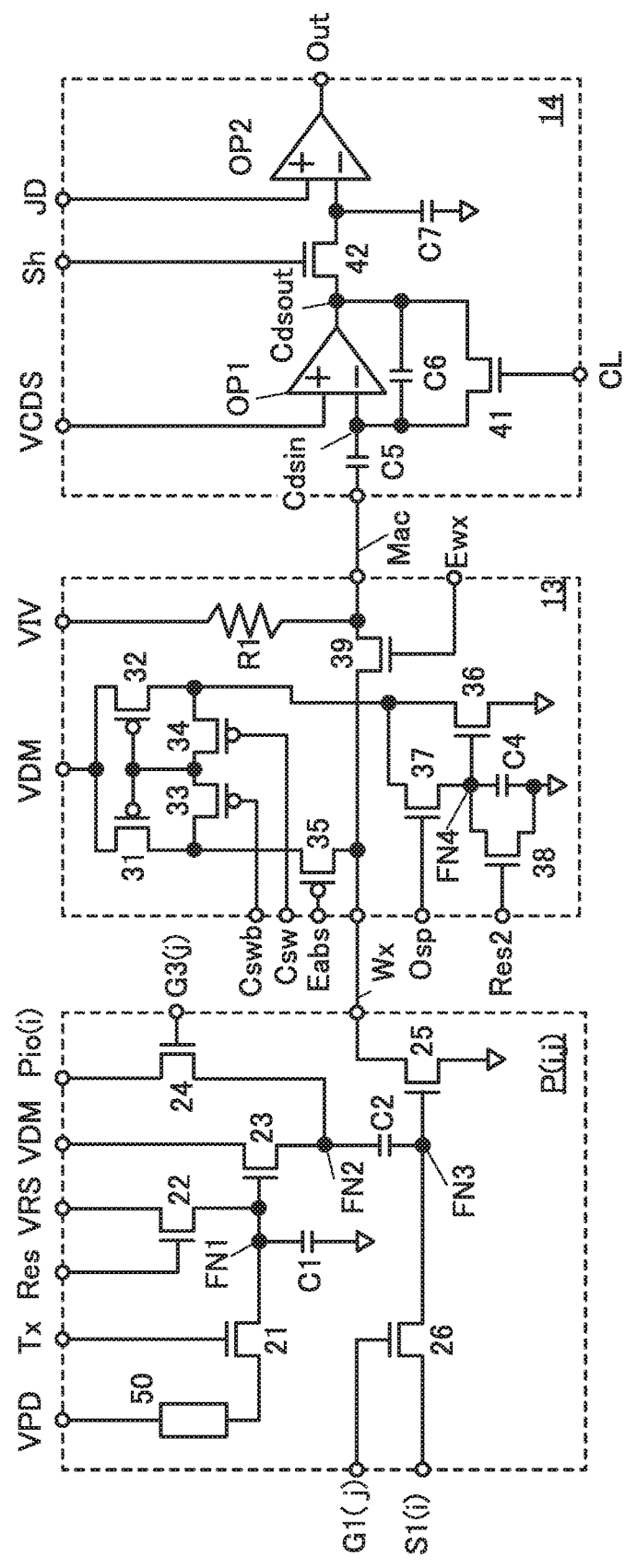
FIG. 5 A circuit diagram illustrating an imaging device.

FIG. 5 illustrates the imaging device 100 including a pixel that is different from that in FIG. 2. Differences from FIG. 2 will be described with regard to FIG. 5. The pixel P(i, j) shown in FIG. 5 is different from the pixel P(i, j) shown in FIG. 2 in further including a signal line Res2(j) while not including the transistor 27 and the capacitor C3.

An operation of the imaging device 100 in FIG. 5 is described with reference to the timing chart of FIG. 6.

In T11, the signal "H" is supplied to the signal line Res, the signal line Res2, the signal line CL, the signal line Sh, and the signal line G3, so that the reset potential (*1) can be supplied to the node FN1, the node FN2, and the node FN4. The node Cdsin and the node Cdsout are each reset by a potential supplied to the wiring VCDS. By supplying the signal "H" to the signal line G1(j), the offset potential W can be supplied to the node FN3 through the signal line S1(i).

In T12, the signal "H" is supplied to the signal line Tx, whereby the node FN1 can be updated to the imaging data data(i, j) (*2) output from the photoelectric conversion element 50 through the transistor 21. The imaging data vi(i, j) (*3) lower than the imaging data data(i, j) by the threshold voltage $V_{th23}$ of the transistor 23 is supplied to the node FN2. Note that the imaging data vi(i, j) means the first data. The second signal in which the imaging data vi(i, j) is added to the offset potential is stored in the node FN3.

In T13, the signal "L" is supplied to the signal line Cswb and the signal line Eabs, whereby the current mirror circuit in FIG. 13 is activated; in addition, the signal "H" is supplied to the signal line Osp, whereby the second signal stored in the node FN 3 can be copied and stored in the node FN4.

In T14, the signal "H" is supplied to the signal line Res, the signal line CL, the signal line Sh, and the signal line G3, so that the reset potential (*1) can be supplied to the node FN1, the node FN2, and the node FN4. Furthermore, the signal "H" is supplied to the signal line G1(j), whereby the third signal (*5) in which the weight potential w(i, j) is added to the offset potential W can be supplied to the node FN3 through the signal line S1(i).

In T15, the signal "H" is supplied to the signal line Tx, whereby the node FN1 can be updated to the imaging data data(i, j) (*2) output from the photoelectric conversion element 50 through the transistor 21. The imaging data vi(i, j) (*3) is output to the node FN 2. Thus, the fourth signal (*6) in which the weight potential w(i, j) is added to the offset potential and the imaging data vi(i, j) is stored in the node FN3.

In T5, the signal "L" is supplied to the signal line Csw, whereby the fifth signal generated by the transistor 36 can be subtracted from the seventh signal generated by the transistor 25. Furthermore, in T15, the signal "H" is supplied to the signal line Ewx, whereby the eighth signal is generated by the resistor R1 and the eighth signal (*7) supplied to the node Cdsin of the circuit 14 can be supplied.

In T16, the signal "H" is supplied to the signal line Csw and the signal line Eabs, whereby the current mirror circuit in the circuit 13 is deactivated. The signal "L" is supplied to the signal line CL, whereby the eighth signal (*7) can be stored in the node Cdsin. Furthermore, the signal "H" is supplied to the signal line G3(j), whereby the node FN2 is updated to the reset potential. Accordingly, the node FN3 is updated to the third signal (*5) and the ninth signal (*8) is generated in the node Cdsin of the circuit 14.

In T17, the signal "H" is supplied to the signal line Sh, whereby the ninth signal (*8) is determined by a determination voltage supplied to the wiring VD and the operation amplifier OP2 can supply a determination result Result (*9) to the wiring Out.

Figure 6:
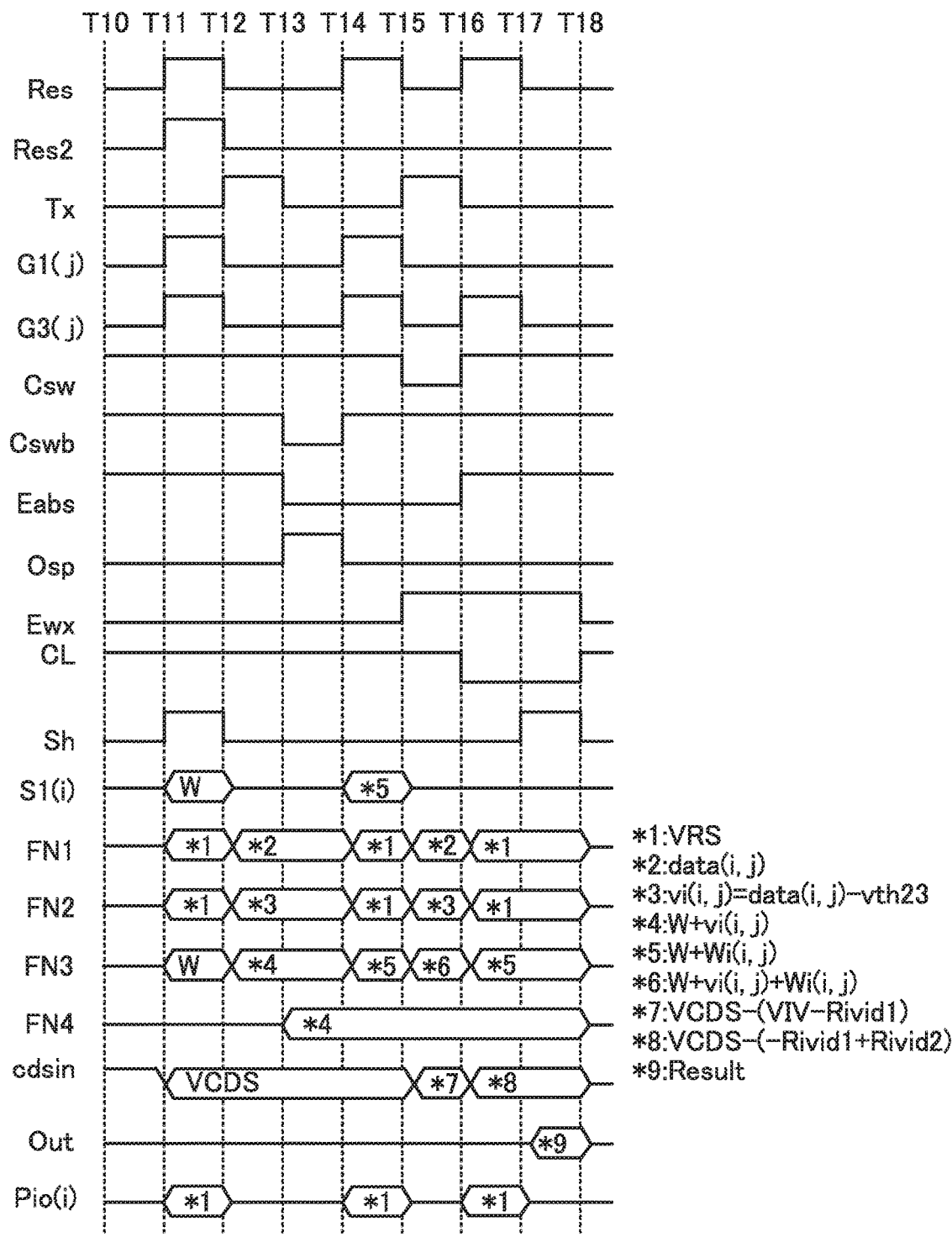
FIG. 6 A timing chart illustrating an operation of an imaging device.

The timing chart of FIG. 6 is characterized in that the pixel P(i, j) in FIG. 5 performs imaging twice. For example, the imaging device 100 with the pixel P illustrated in FIG. 5 is suitably used under a stable light source in course of an inspection operation in a factory. The imaging device 100 can include a larger number of pixels P by reducing the components of the pixel P. Thus, a detailed inspection with higher definition can be achieved in the inspection operation.

The structure and method described in this embodiment can be used by being combined as appropriate with the structures and methods described in the other embodiments.

Embodiment 2

In this embodiment, examples of an imaging device are described with reference to drawings.

<Structure Examples of Pixel Circuit>

Figure 7A:
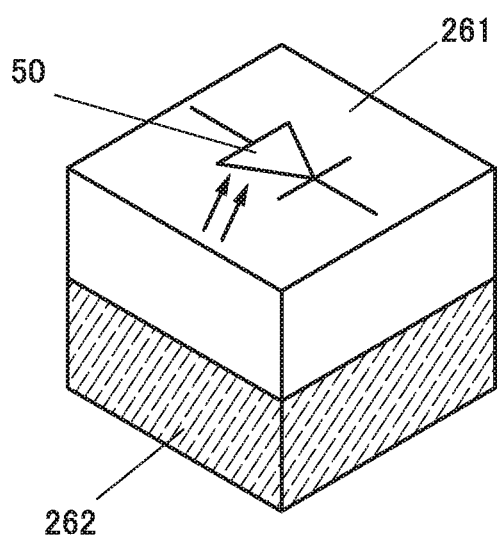
FIG. 7 Drawings each illustrating a structure of a pixel of an imaging device.

FIG. 7(A) illustrates a structure example of a pixel including the pixel circuit described in Embodiment 1. The pixel illustrated in FIG. 7(A) is an example having a multilayer structure of a layer 261 and a layer 262.

The layer 261 includes the photoelectric conversion element 50. As illustrated in FIG. 7(C), the photoelectric conversion element 50 can be a multilayer of a layer 265a, a layer 265b, and a layer 265c.

The photoelectric conversion element 50 illustrated in FIG. 7(C) is a pn-junction photodiode; for example, a $p^+$-type semiconductor, an n-type semiconductor, and an $n^+$-type semiconductor can be used for the layer 265a, the layer 265b, and the layer 265c, respectively. Alternatively, an $n^+$-type semiconductor, a p-type semiconductor, and a $p^+$-type semiconductor may be used for the layer 265a, the layer 265b, and the layer 265c, respectively. Alternatively, a pin-junction photodiode in which the layer 265b is an i-type semiconductor may be used.

The above-described pn-junction photodiode or pin-junction photodiode can be formed using single crystal silicon. Furthermore, the pin-junction photodiode can also be formed using a thin film of amorphous silicon, microcrystalline silicon, polycrystalline silicon, or the like.

Figure 7B:
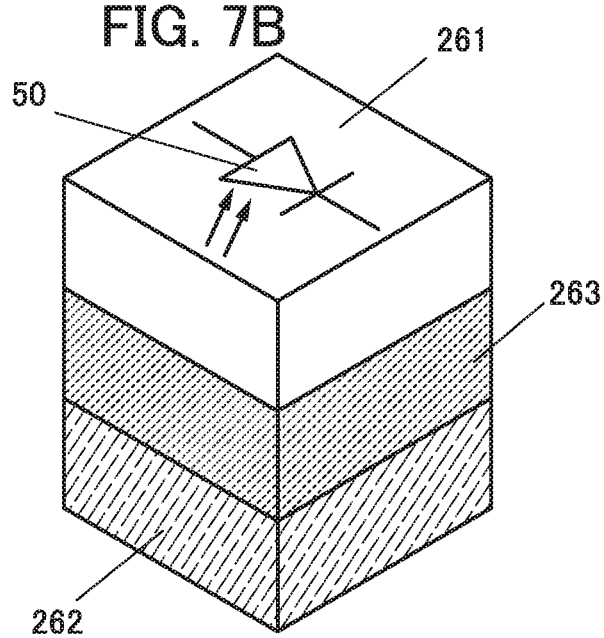
Figure 7C:
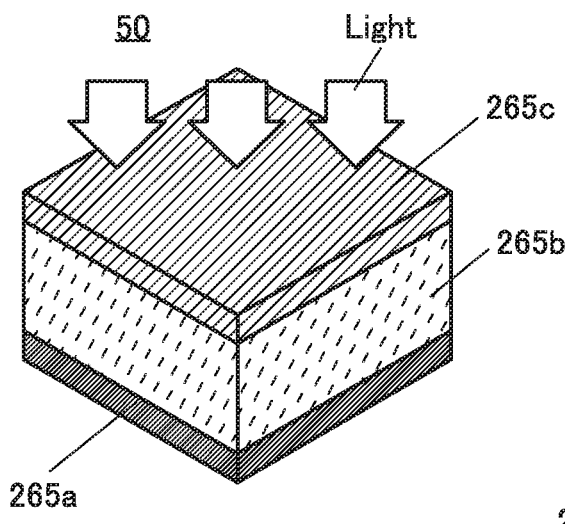
Figure 7D:
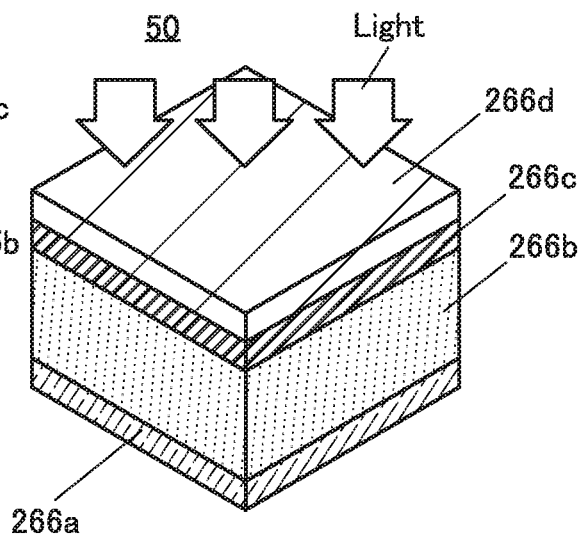

The photoelectric conversion element 50 included in the layer 261 may be a multilayer of a layer 266a, a layer 266b, a layer 266c, and a layer 266d as illustrated in FIG. 7(D). The photoelectric conversion element 50 illustrated in FIG. 7(D) is an example of an avalanche photodiode, and the layer 266a and the layer 266d correspond to electrodes and the layer 266b and the layer 266c correspond to a photoelectric conversion portion.

The layer 266a is preferably a low-resistance metal layer or the like. For example, aluminum, titanium, tungsten, tantalum, silver, or a multilayer thereof can be used.

As the layer 266d, a conductive layer having a high visible light-transmitting property is preferably used. For example, indium oxide, tin oxide, zinc oxide, indium tin oxide, gallium zinc oxide, indium gallium zinc oxide, graphene, or the like can be used. Note that the layer 266d can be omitted.

The layer 266b and the layer 266c of the photoelectric conversion portion can have, for example, a structure of a pn-junction photodiode with a selenium-based material for a photoelectric conversion layer. A selenium-based material, which is a p-type semiconductor, is preferably used for the layer 266b, and gallium oxide or the like, which is an n-type semiconductor, is preferably used for the layer 266c.

The photoelectric conversion element with a selenium-based material has a property of high external quantum efficiency with respect to visible light. In the photoelectric conversion element, the amount of amplification of carriers with respect to the amount of incident light can be increased by utilizing the avalanche multiplication. A selenium-based material has a high light-absorption coefficient, and thus has advantages in production; for example, a photoelectric conversion layer can be fabricated as a thin film. A thin film of a selenium-based material can be formed by a vacuum evaporation method, a sputtering method, or the like.

As the selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed with a material having a wide band gap and a visible light-transmitting property. For example, zinc oxide, gallium oxide, indium oxide, tin oxide, or a mixed oxide thereof can be used. In addition, these materials also have a function as a hole injection blocking layer, and a dark current can be decreased.

As the layer 262 illustrated in FIG. 7(A), a silicon substrate can be used, for example. A Si transistor and the like are provided using the silicon substrate, and in addition to the above-described pixel circuit, a circuit for driving the pixel circuit, a circuit for reading an image signal, an image processing circuit, and the like can be provided.

Furthermore, the pixel may have a multilayer structure of the layer 261, a layer 263, and the layer 262 as illustrated in FIG. 7(B).

The layer 263 can include OS transistors (for example, the transistors 21 and 22 of the pixel circuit). In that case, the layer 262 preferably includes Si transistors (for example, the transistors 23 and 25 of the pixel circuit).

With such a structure, components of the pixel circuit can be dispersed in a plurality of layers and the components can be provided to overlap with each other, whereby the area of the imaging device can be reduced. Note that in the structure of FIG. 7(B), the layer 262 may be a support substrate, and the pixel circuit may be provided in the layer 261 and the layer 263.

Figure 8A:
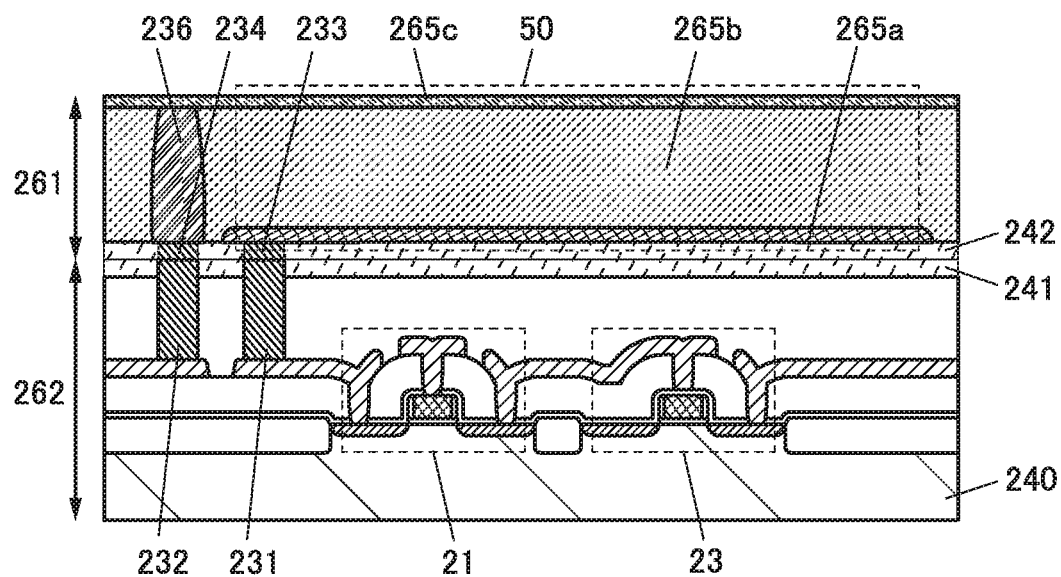
FIG. 8 Drawings each illustrating a structure of a pixel of an imaging device.

FIG. 8(A) is a diagram illustrating an example of a cross section of the pixel illustrated in FIG. 7(A). The layer 261 includes a pn-junction photodiode with silicon for a photoelectric conversion layer, as the photoelectric conversion element 50. The layer 262 includes a Si transistor and the like included in the pixel circuit.

In the photoelectric conversion element 50, the layer 265a can be a p$^+$-type region, the layer 265b can be an n-type region, and the layer 265c can be an n$^+$-type region. In the layer 265b, a region 236 for connection between a power supply line and the layer 265c is provided. For example, the region 236 can be a p$^+$-type region.

Figure 10A:
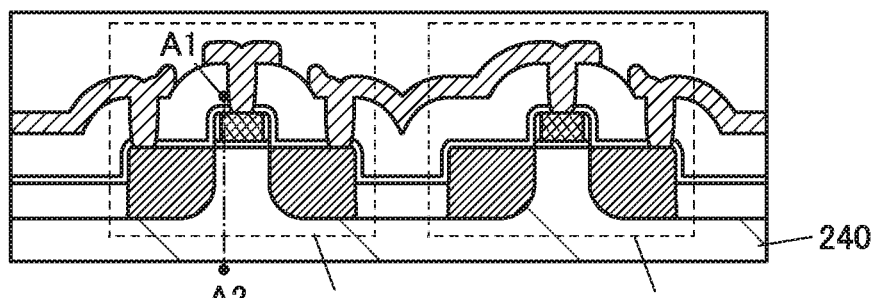
FIG. 10 Drawings each illustrating a structure of a pixel of an imaging device.
Figure 10B:
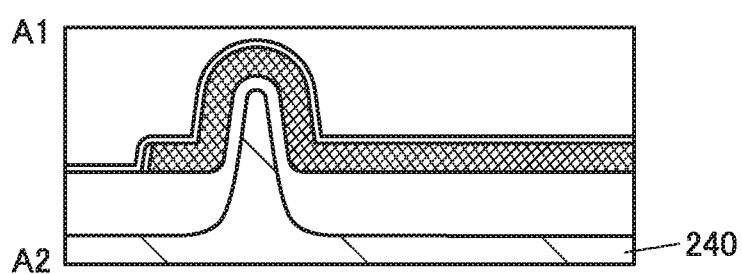

Although the Si transistor illustrated in FIG. 8(A) is of a planar type including a channel formation region in the silicon substrate 240, a structure including a fin semiconductor layer in the silicon substrate 240 as illustrated in FIGS. 10(A) and 10(B) may be employed. FIG. 10(A) corresponds to a cross section in the channel length direction and FIG. 10(B) corresponds to a cross section in the channel width direction.

Figure 10C:
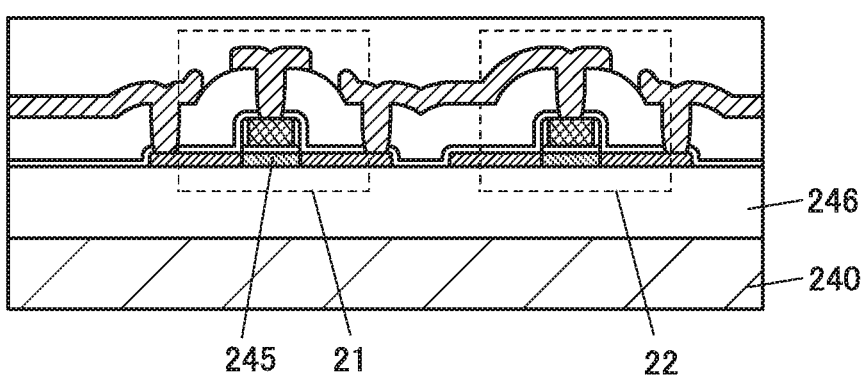

Alternatively, as illustrated in FIG. 10(C), transistors each including a semiconductor layer 245 of a silicon thin film may be used. The semiconductor layer 245 can be single crystal silicon formed on an insulating layer 246 on the silicon substrate 240 (SOI (Silicon on Insulator)), for example.

Here, FIG. 8(A) illustrates a structure example in which electrical connection between elements of the layer 261 and elements of the layer 262 is obtained by bonding technique.

An insulating layer 242, a conductive layer 233, and a conductive layer 234 are provided in the layer 261. The conductive layer 233 and the conductive layer 234 each include a region embedded in the insulating layer 242. The conductive layer 233 is electrically connected to the layer 265a. The conductive layer 234 is electrically connected to the region 236. Furthermore, surfaces of the insulating layer 242, the conductive layer 233, and the conductive layer 234 are planarized to be level with each other.

An insulating layer 241, a conductive layer 231, and a conductive layer 232 are provided in the layer 262. The conductive layer 231 and the conductive layer 232 each include a region embedded in the insulating layer 241. The conductive layer 232 is electrically connected to a power supply line. The conductive layer 231 is electrically connected to the source or the drain of the transistor 21. Furthermore, surfaces of the insulating layer 241, the conductive layer 231, and the conductive layer 232 are planarized to be level with each other.

Here, main components of the conductive layer 231 and the conductive layer 233 are preferably the same metal element. Main components of the conductive layer 232 and the conductive layer 234 are preferably the same metal element. Furthermore, the insulating layer 241 and the insulating layer 242 are preferably formed of the same component.

For example, for the conductive layers 231, 232, 233, and 234, Cu, Al, Sn, Zn, W, Ag, Pt, Au, or the like can be used. Preferably, Cu, Al, W, or Au is used for easy bonding. In addition, for the insulating layers 241 and 242, silicon oxide, silicon oxynitride, silicon nitride oxide, silicon nitride, titanium nitride, or the like can be used.

That is, the same metal element described above is preferably used for a combination of the conductive layer 231 and the conductive layer 233, and the same metal element described above is preferably used for a combination of the conductive layer 232 and the conductive layer 234. Furthermore, the same insulating material described above is preferably used for the insulating layer 241 and the insulating layer 242. With this structure, bonding with a bonding position at a boundary between the layer 261 and the layer 262 can be performed.

By the bonding, the electrical connection in the combination of the conductive layer 231 and the conductive layer 233 and that in the combination of the conductive layer 232 and the conductive layer 234 can be obtained. In addition, connection between the insulating layer 241 and the insulating layer 242 with mechanical strength can be obtained.

For bonding the metal layers to each other, a surface activated bonding method in which an oxide film, a layer adsorbing impurities, and the like on the surface are removed by sputtering processing or the like and the cleaned and activated surfaces are brought into contact to be bonded to each other can be used. Alternatively, a diffusion bonding method in which the surfaces are bonded to each other by using temperature and pressure together or the like can be used. Both methods cause bonding at an atomic level, and therefore not only electrically but also mechanically excellent bonding can be achieved.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are brought into contact to be bonded to each other temporarily, and then dehydrated by heat treatment to perform final bonding. The hydrophilic bonding method can also cause bonding at an atomic level; thus, mechanically excellent bonding can be achieved.

When the layer 261 and the layer 262 are bonded to each other, the insulating layers and the metal layers coexist on their bonding surfaces; therefore, the surface activated bonding method and the hydrophilic bonding method are performed in combination, for example.

For example, a method can be used in which polishing, surface cleaning, antioxidant treatment on the metal layer surfaces, and hydrophilicity treatment for bonding are performed in this order. Hydrophilicity treatment may be performed with the metal layers having surfaces of hardly oxidizable metal such as Au. Note that a bonding method other than the above-mentioned methods may be used.

Figure 8B:
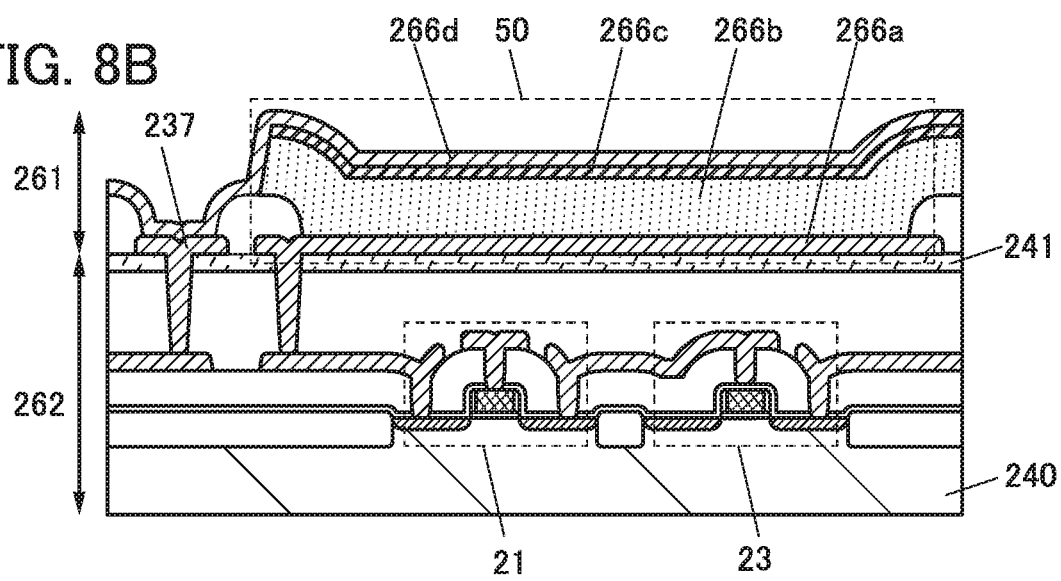

FIG. 8(B) is a cross-sectional view of the case where a pn-junction photodiode with a selenium-based material for a photoelectric conversion layer is used for the layer 261 of the pixel illustrated in FIG. 7(A). The layer 266*a* is included as one electrode, the layers 266*b* and 266*c* are included as the photoelectric conversion layer, and the layer 266*d* is included as the other electrode.

In this case, the layer 261 can be directly formed on the layer 262. The layer 266*a* is electrically connected to the source or the drain of the transistor 21. The layer 266*d* is electrically connected to a power supply line through a conductive layer 237.

Figure 9A:
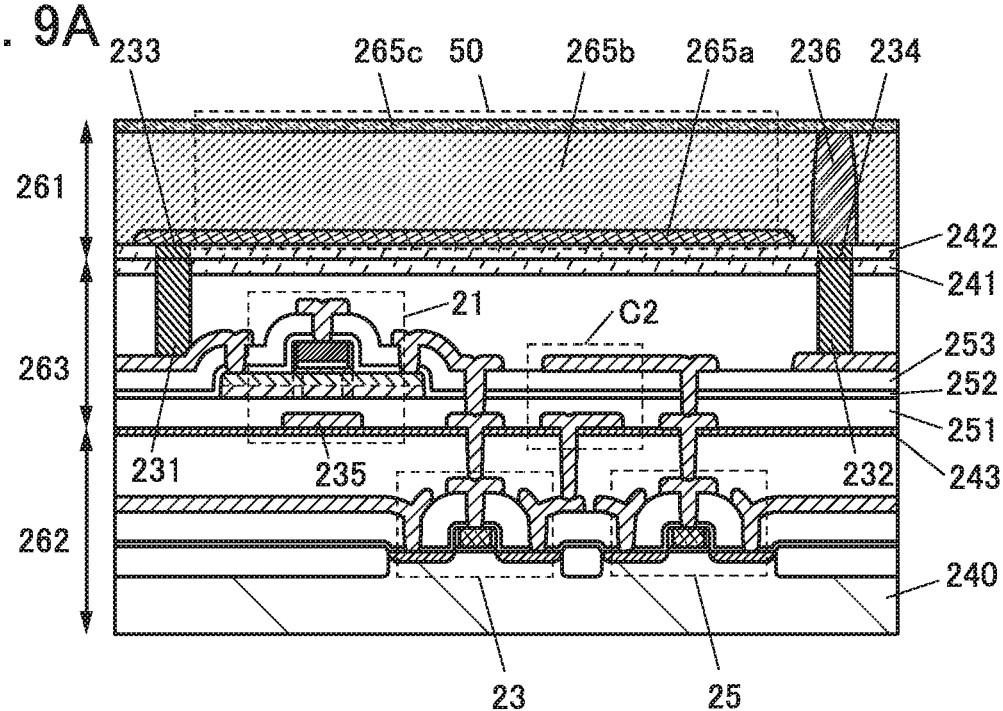
FIG. 9 Drawings each illustrating a structure of a pixel of an imaging device.

FIG. 9(A) is a diagram illustrating an example of a cross section of the pixel illustrated in FIG. 7(B). The layer 261 includes a pn-junction photodiode with silicon for a photoelectric conversion layer, as the photoelectric conversion element 50. The layer 262 includes a Si transistor and the like. The layer 263 includes an OS transistor and the like. A structure example is illustrated in which electrical connection between the layer 261 and the layer 263 is obtained by bonding.

Figure 10D:
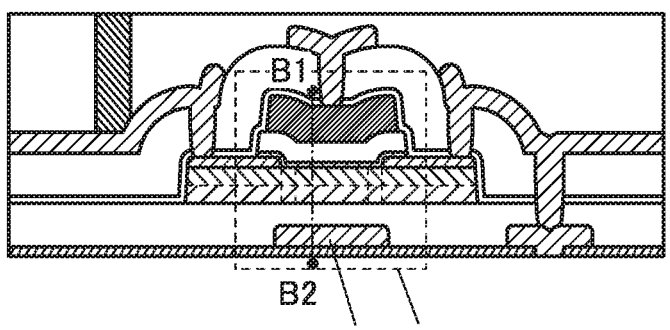

Although the OS transistor having a self-aligned structure is illustrated in FIG. 9(A), a non-self-aligned top-gate transistor may also be used as illustrated in FIG. 10(D).

Figure 10E:
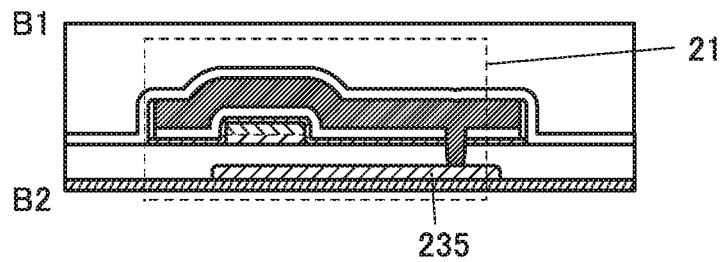

Although the transistor 21 includes a back gate 235, a mode without the back gate may be employed. As illustrated in FIG. 10(E), the back gate 235 may be electrically connected to a front gate of the transistor, which is provided to face the back gate 235. Alternatively, a structure in which a fixed potential different from that for the front gate can be supplied to the back gate 235 may be employed.

The capacitor C2 can be formed with the insulating layers 251, 252, and 253 provided between the conductive layer for forming the back gate 235 and the conductive layer 231.

An insulating layer 243 that has a function of inhibiting diffusion of hydrogen is provided between a region where the OS transistor is formed and a region where the Si transistors are formed. Dangling bonds of silicon are terminated with hydrogen in an insulating layer provided in the vicinity of channel formation regions of the transistors 23 and 25. Meanwhile, hydrogen in an insulating layer provided in the vicinity of a channel formation region of the transistor 21 is one of the factors generating carriers in the oxide semiconductor layer.

Hydrogen is confined in one layer by the insulating layer 243, so that the reliability of the transistors 23 and 25 can be improved. Furthermore, diffusion of hydrogen from the one layer to the other layer is inhibited, so that the reliability of the transistor 21 can also be improved.

For the insulating layer 243, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

Figure 9B:
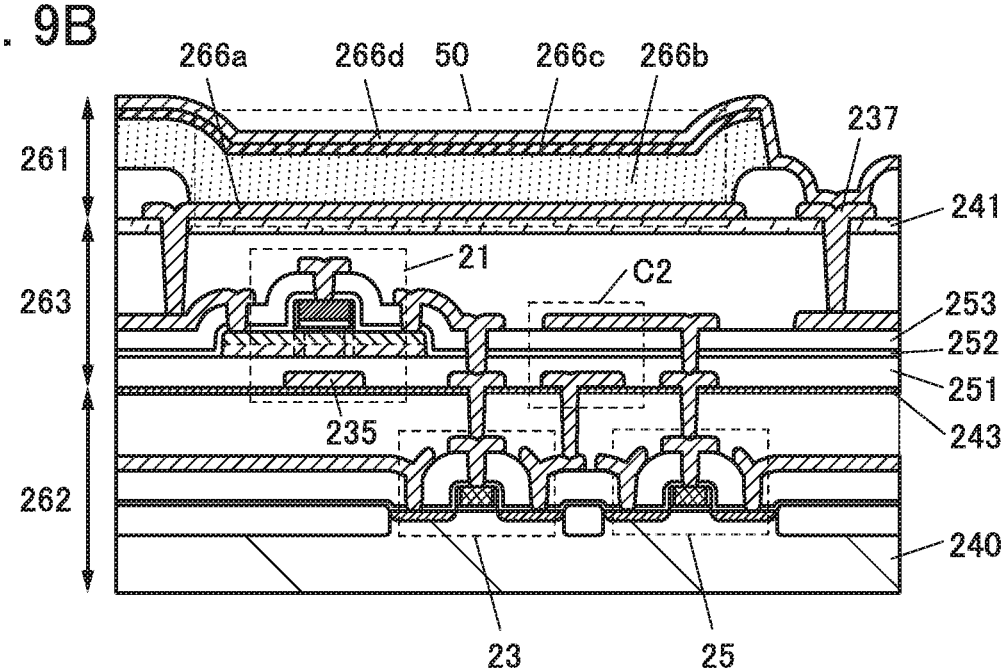

FIG. 9(B) is a cross-sectional view of the case where a pn-junction photodiode with a selenium-based material for a photoelectric conversion layer is used for the layer 261 of the pixel illustrated in FIG. 7(B). The layer 261 can be directly formed on the layer 263. The above description can be referred to for the details of the layers 261, 262, and 263.

<Other Components of Pixel>

Figure 11A:
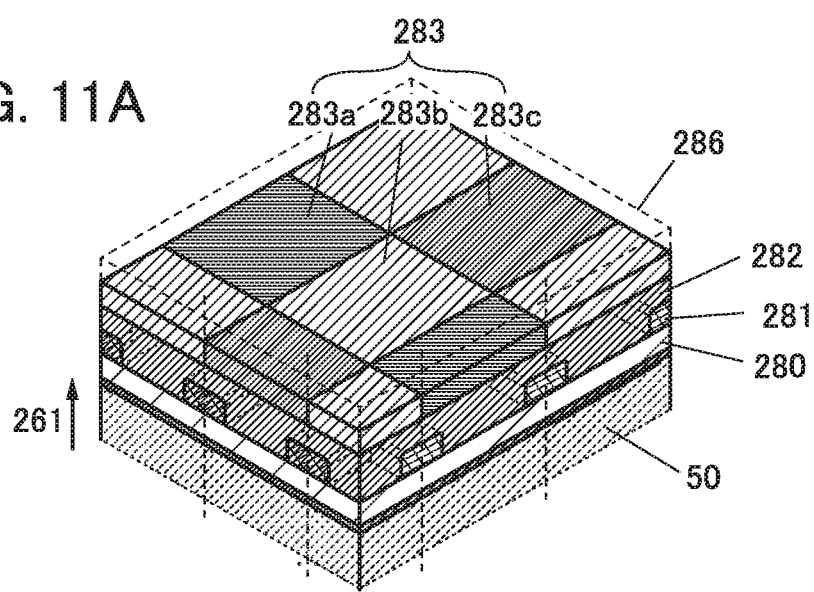
FIG. 11 Drawings each illustrating a structure of a pixel of an imaging device.

FIG. 11(A) is a perspective view illustrating an example in which a color filter and the like are added to the pixel of the imaging device of one embodiment of the present invention. In the perspective view, cross sections of a plurality of pixels are also illustrated. An insulating layer 280 is formed over the layer 261 where the photoelectric conversion element 50 is formed. As the insulating layer 280, a silicon oxide film with a high visible light-transmitting property can be used, for example. A silicon nitride film may be stacked as a passivation film. A dielectric film of hafnium oxide or the like may be stacked as an anti-reflection film.

A light-blocking layer 281 may be formed over the insulating layer 280. The light-blocking layer 281 has a function of preventing color mixing of light passing through the upper color filter. As the light-blocking layer 281, a metal layer of aluminum, tungsten, or the like can be used. The metal layer and a dielectric film having a function as an anti-reflection film may be stacked.

An organic resin layer 282 can be provided as a planarization film over the insulating layer 280 and the light-blocking layer 281. A color filter 283 (color filters 283*a*, 283*b*, and 283*c*) is formed in each pixel. For example, colors of R (red), G (green), B (blue), Y (yellow), C (cyan), M (magenta), or the like are assigned to the color filters 283*a*, 283*b*, and 283*c*, so that a color image can be obtained.

An insulating layer 286 or the like having a visible light-transmitting property can be provided over the color filter 283.

Figure 11B:
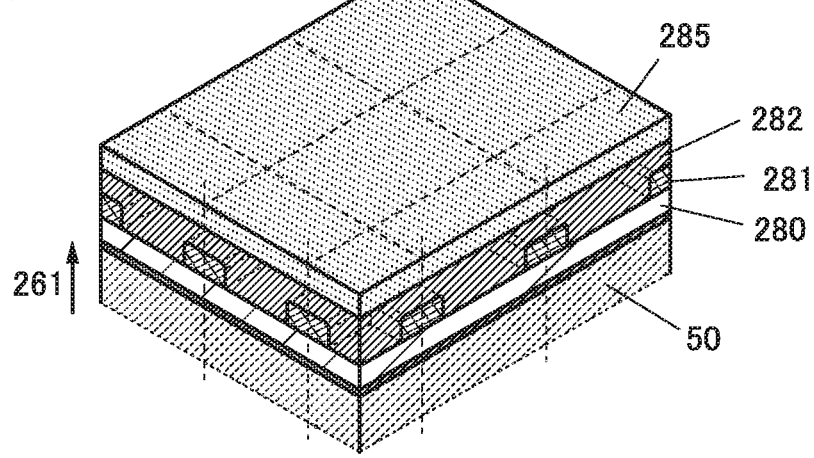

As illustrated in FIG. 11(B), an optical conversion layer 285 may be used instead of the color filter 283. Such a structure enables the imaging device to take images in various wavelength regions.

When a filter that blocks light with a wavelength shorter than or equal to the wavelength of visible light is used as the optical conversion layer 285, for example, the device can be used as an infrared imaging device. When a filter that blocks light with a wavelength shorter than or equal to the wavelength of near infrared light is used as the photoelectric conversion layer 285, the device can be used as a far-infrared imaging device. When a filter that blocks light with a wavelength longer than or equal to the wavelength of visible light is used as the photoelectric conversion layer 285, the device can be used as an ultraviolet imaging device. A visible light color filter and an infrared or ultraviolet filter may be combined.

Furthermore, when a scintillator is used for the optical conversion layer 285, the device can be used as an imaging device for taking an image visualizing the intensity of radiation which is used for an X-ray imaging device or the like. Radiations such as X-rays that pass through an object to enter a scintillator are converted into light (fluorescence) such as visible light or ultraviolet light owing to a photoluminescence phenomenon. Then, the light is detected by the photoelectric conversion element 50, whereby image data is obtained. Moreover, the imaging device having the above structure may be used in a radiation detector or the like.

A scintillator contains a substance that, when irradiated with radiation such as X-rays or gamma rays, absorbs energy thereof to emit visible light or ultraviolet light. For example, it is possible to use a resin or ceramics in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed.

In the photoelectric conversion element 50 using a selenium-based material, radiation such as X-rays can be directly converted into charge; thus, a structure in which the scintillator is unnecessarily can be obtained.

Figure 11C:
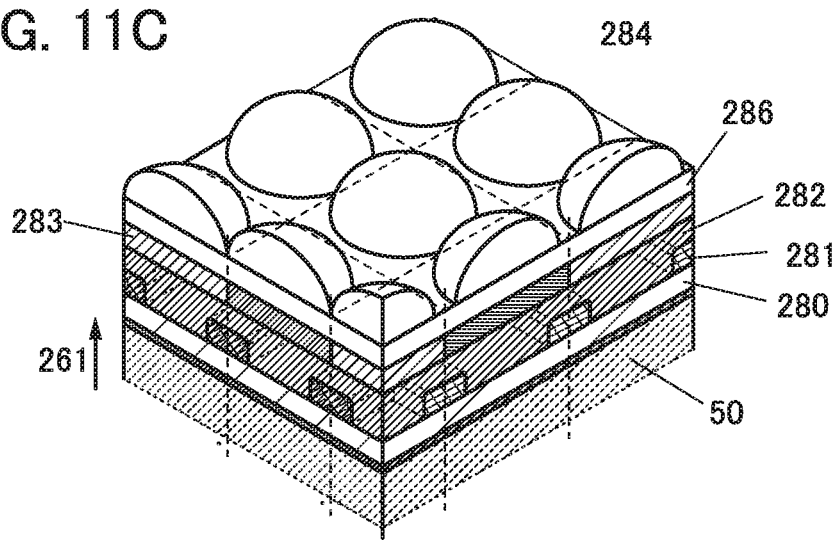

As illustrated in FIG. 11(C), a microlens array 284 may be provided over the color filter 283. Light passing through an individual lens of the microlens array 284 goes through the color filter 283 directly under that lens and the photoelectric conversion element 50 is irradiated with the light. The microlens array 284 may be provided over the optical conversion layer 285 illustrated in FIG. 11(B).

<Structure Examples of Package and Module>

Hereinafter, examples of a package and a camera module in each of which an image sensor chip is placed will be described. For the image sensor chip, the structure of the above-described imaging device can be used.

FIG. 12(A1) is an external perspective view of the top surface side of a package in which an image sensor chip is placed. The package includes a package substrate 410 to which an image sensor chip 450 is fixed, a cover glass 420, an adhesive 430 for bonding the package substrate 410 and the cover glass 420, and the like.

FIG. 12(A2) is an external perspective view of the bottom surface side of the package. A BGA (Ball grid array) in which solder balls serve as bumps 440 is provided on the bottom surface of the package. Note that, other than the BGA, an LGA (Land grid array), a PGA (Pin Grid Array), or the like may be provided.

FIG. 12(A3) is a perspective view of the package, in which some parts of the cover glass 420 and the adhesive 430 are not illustrated. Electrode pads 460 are formed over the package substrate 410, and the electrode pads 460 and the bumps 440 are electrically connected via through-holes. The electrode pads 460 are electrically connected to the image sensor chip 450 through wires 470.

FIG. 12(B1) is an external perspective view of the top surface side of a camera module in which an image sensor chip is placed in a package with a built-in lens. The camera module includes a package substrate 411 to which an image sensor chip 451 is fixed, a lens cover 421, a lens 435, and the like. Furthermore, an IC chip 490 having functions as a driver circuit, a signal conversion circuit, and the like of an imaging device is also provided between the package substrate 411 and the image sensor chip 451; thus, the structure as an SiP (System in package) is included.

FIG. 12(B2) is an external perspective view of the bottom surface side of the camera module. The bottom surface and side surfaces of the package substrate 411 has a QFN (Quad flat no-lead package) structure in which lands 441 for installation are provided. Note that this structure is an example, and a QFP (Quad flat package) or the above-mentioned BGA may be employed.

FIG. 12(B3) is a perspective view of the module, in which some parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed substrate or the like, and the image sensor chip can be incorporated into a variety of semiconductor devices and electronic devices.

Embodiment 3

As electronic devices that can include the imaging device of one embodiment of the present invention, display devices, personal computers, image memory devices or image reproducing devices provided with a recording medium, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given.

Such electronic devices are each preferably provided with the imaging device of one embodiment of the present invention. Furthermore, the electronic devices are each preferably provided with the neural network 17. The neural network 17 can reduce processing and power consumption in image recognition as compared with feature detection by a processor. Thus, the imaging device of one embodiment of the present invention includes the neural network interface for outputting data subjected to pooling processing to the neural network 17.

As an example, FIG. 13 illustrates a control portion common in electronic devices. The control portion of an electronic device preferably includes the imaging device of one embodiment of the present invention, the neural network 17, the processor 18, and a communication module 19. The imaging device includes the circuit 14 that functions as a neural network interface and the analog/digital converter circuit 15 that outputs imaging data as an image. The neural network 17 includes a GPU (Graphics Processing Unit) 17*a*, a memory device 17*b*, and a plurality of sensors 17*c*.

It is preferable that an output of the circuit 14 be directly connected to the GPU 17*a*. Alternatively, the output of the circuit 14 may be connected to a common bus of the neural network 17. The sensor may include any one or more of an acceleration sensor, a direction sensor, a pressure sensor, a temperature sensor, a humidity sensor, an illuminance sensor, a positioning sensor (e.g., a GPS (global positioning system)), and the like. Controlling data acquired by the imaging device and data acquired with the sensor, the electronic device can control or monitor the usage state of the electronic device and the state of an object that the electronic device is to control.

Specific examples of these electronic devices are shown in FIG. 14.

Figure 14A:
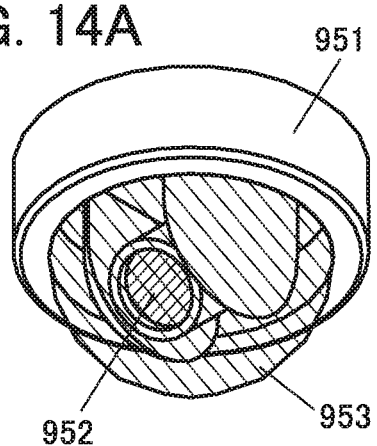
FIG. 14 Drawings each illustrating a structure example of an electronic device.

FIG. 14(A) is a surveillance camera which includes a support base 951, a camera unit 952, a protective cover 953, and the like. The camera unit 952 is provided with a rotation mechanism and the like and can capture images of all of the surroundings when provided on a ceiling. The imaging device of one embodiment of the present invention can be included, as a component for obtaining an image, in the camera unit. Note that a surveillance camera is a name in common use and the name does not limit the use thereof. A device that has a function as a surveillance camera can also be called a camera or a video camera, for example.

Figure 14B:
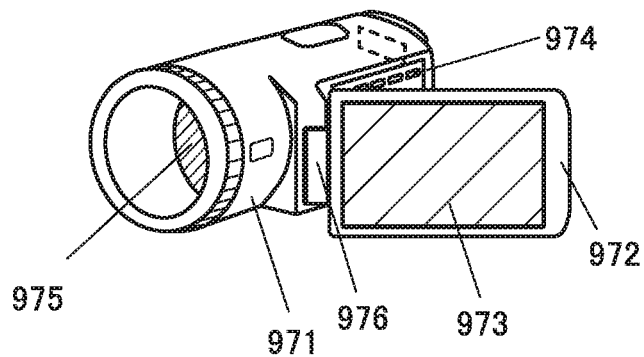

FIG. 14(B) is a video camera which includes a first housing 971, a second housing 972, a display portion 973, an operation key 974, a lens 975, a connection portion 976, and the like. The operation key 974 and the lens 975 are provided on the first housing 971, and the display portion 973 is provided on the second housing 972. The imaging device of one embodiment of the present invention can be included, as a component for obtaining an image, in the video camera.

Figure 14C:
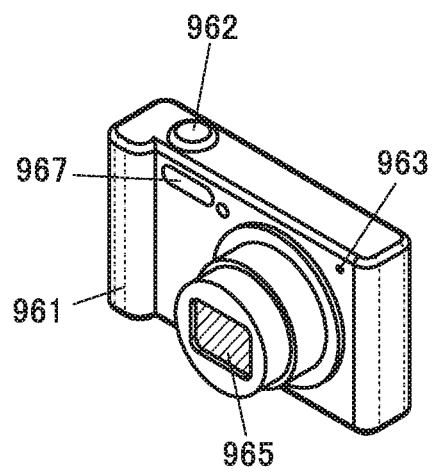

FIG. 14(C) is a digital camera which includes a housing 961, a shutter button 962, a microphone 963, a light-emitting portion 967, a lens 965, and the like. The imaging device of one embodiment of the present invention can be included, as a component for obtaining an image, in the digital camera.

Figure 14D:
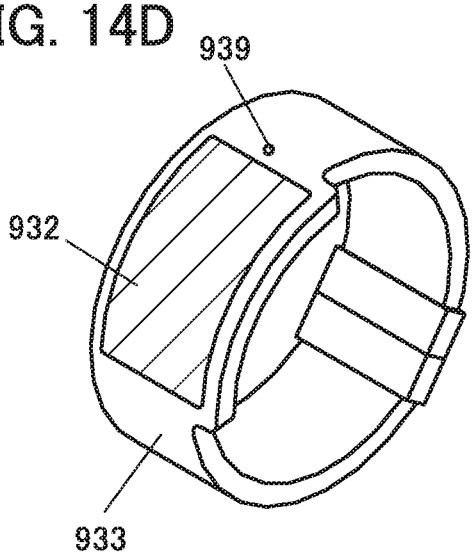

FIG. 14(D) is a wrist-watch-type information terminal which includes a display portion 932, a housing 933 also serving as a wristband, a camera 939, and the like. The display portion 932 is provided with a touch panel for operating the information terminal. The display portion 932 and the housing 933 also serving as a wristband have flexibility and fit a body well. The imaging device of one embodiment of the present invention can be included, as a component for obtaining an image, in the information terminal.

Figure 14E:
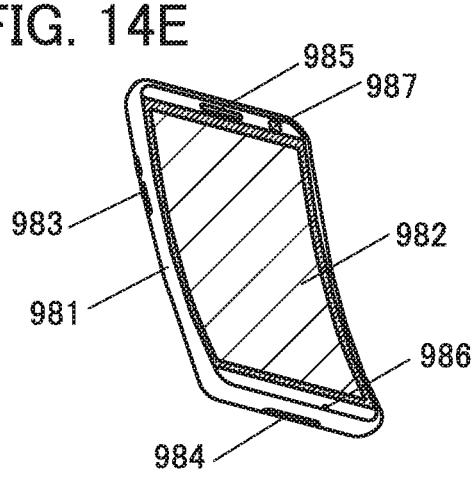

FIG. 14(E) is an example of a cellular phone which includes a housing 981, a display portion 982, an operation button 983, an external connection port 984, a speaker 985, a microphone 986, a camera 987, and the like. The display portion 982 of the cellular phone includes a touch sensor. All operations including making a call and inputting text can be performed by touch on the display portion 982 with a finger, a stylus, or the like. The imaging device of one embodiment of the present invention can be included, as a component for obtaining an image, in the cellular phone.

Figure 14F:
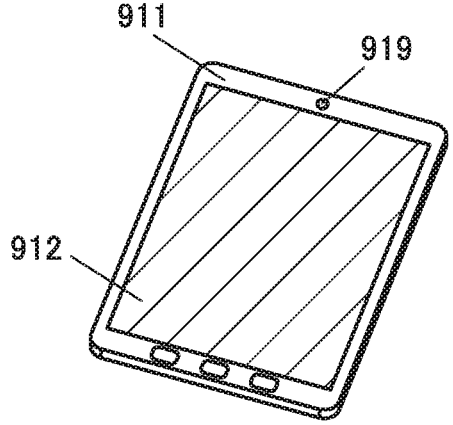

FIG. 14(F) is a portable data terminal which includes a housing 911, a display portion 912, a camera 919, and the like. Input and output of information can be performed by a touch panel function of the display portion 912. The imaging device of one embodiment of the present invention can be included, as a component for obtaining an image, in the portable data terminal.

In this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL (electroluminescence) element (an EL element including organic and inorganic materials, an organic EL element, or an inorganic EL element), an LED chip (a white LED chip, a red LED chip, a green LED chip, a blue LED chip, or the like), a transistor (a transistor that emits light depending on a current), a plasma display panel (PDP), an electron emitter, a display element including a carbon nanotube, a liquid crystal element, electronic ink, an electrowetting element, an electrophoretic element, a display element using MEMS (microelectromechanical systems) (for example, a grating light valve (GLV), a digital micromirror device (DMD), a DMS (digital micro shutter), MIRASOL (a registered trademark), an IMOD (interferometric modulation) element, a MEMS shutter display element, an optical-interference-type MEMS display element, or a piezoelectric ceramic display), and quantum dots. Other than the above, the display element, the display device, the light-emitting element, or the light-emitting device may include a display media whose contrast, luminance, reflectivity, transmittance, or the like changes by electrical or magnetic effect. Examples of a display device having EL elements include an EL display. Examples of a display device including an electron emitter include a field emission display (FED) and an SED-type flat panel display (SED: Surface-conduction Electron-emitter Display). Examples of a display device using a liquid crystal element include a liquid crystal display (a transmissive liquid crystal display, a transflective liquid crystal display, a reflective liquid crystal display, a direct-view liquid crystal display, or a projection liquid crystal display). Examples of display devices using electronic ink, electronic liquid powder (a registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. Note that to achieve a transflective liquid crystal display or a reflective liquid crystal display, some or all of pixel electrodes function as reflective electrodes. For example, some or all of pixel electrodes contain aluminum, silver, or the like. Moreover, in such a case, a memory circuit such as SRAM can be provided under the reflective electrodes. Thus, the power consumption can be further reduced. Note that in the case where an LED chip is used, graphene or graphite may be provided under an electrode or a nitride semiconductor of the LED chip. Graphene or graphite may be a multilayer film in which a plurality of layers are stacked. Providing graphene or graphite in the above manner facilitates formation of a nitride semiconductor, such as an n-type GaN semiconductor layer including crystals, thereover. Furthermore, a p-type GaN semiconductor layer including crystals or the like can be provided thereover, and thus the LED chip can be formed. Note that an AlN layer may be provided between graphene or graphite and the n-type GaN semiconductor layer including crystals. The GaN semiconductor layer included in the LED chip may be formed by MOCVD. Note that when graphene is provided, the GaN semiconductor layer included in the LED chip can also be formed by a sputtering method. In the case of a display element including MEMS (microelectromechanical systems), a drying agent may be provided in a space where the display element is sealed (for example, between an element substrate over which the display element is placed and a counter substrate provided opposite to the element substrate). Providing a drying agent can prevent MEMS and the like from becoming difficult to move or deteriorating easily because of moisture.

An example of installation of a display system of one embodiment of the present invention in a vehicle will be described with reference to FIGS. 15(A) and 15(B).

Figure 15A:
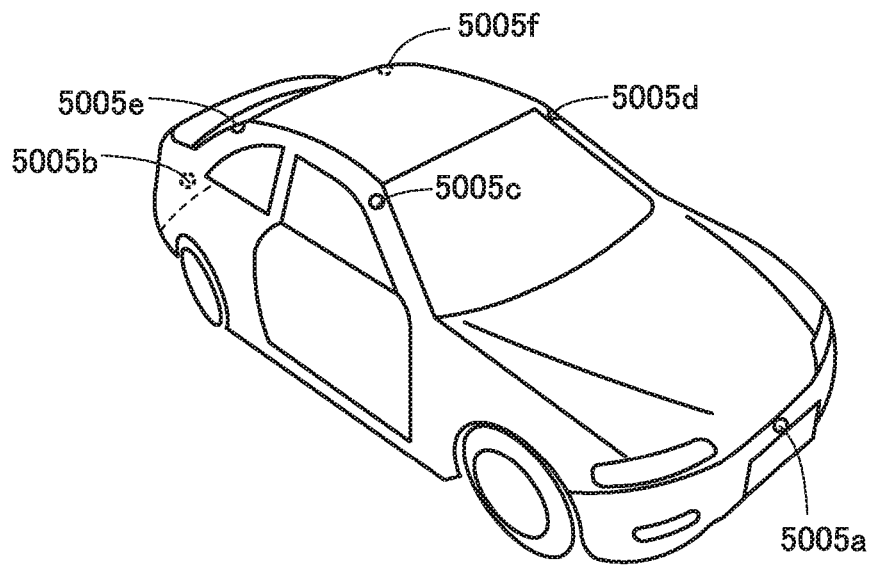
FIG. 15 Drawings illustrating a structure example of an electronic device.

FIG. 15(A) illustrates an appearance of a vehicle 5000. The vehicle 5000 includes a plurality of cameras 5005 (a camera 5005a, a camera 5005b, a camera 5005c, a camera 5005d, a camera 5005e, and a camera 5005f in FIG. 15(A)). For example, the camera 5005a has a function of taking a picture of a front scene, the camera 5005b has a function of taking a picture of a rear scene, the camera 5005c has a function of taking a picture of a front right scene, the camera 5005d has a function of taking a picture of a front left scene, the camera 5005e has a function of taking a picture of a rear right scene, and the camera 5005f has a function of taking a picture of a rear light scene. Note that the number and the function of cameras that take pictures of the surroundings of the vehicle are not limited to those in the above structure. For example, a camera that takes a picture of a rear view may be provided on the front side of the vehicle.

Figure 15B:
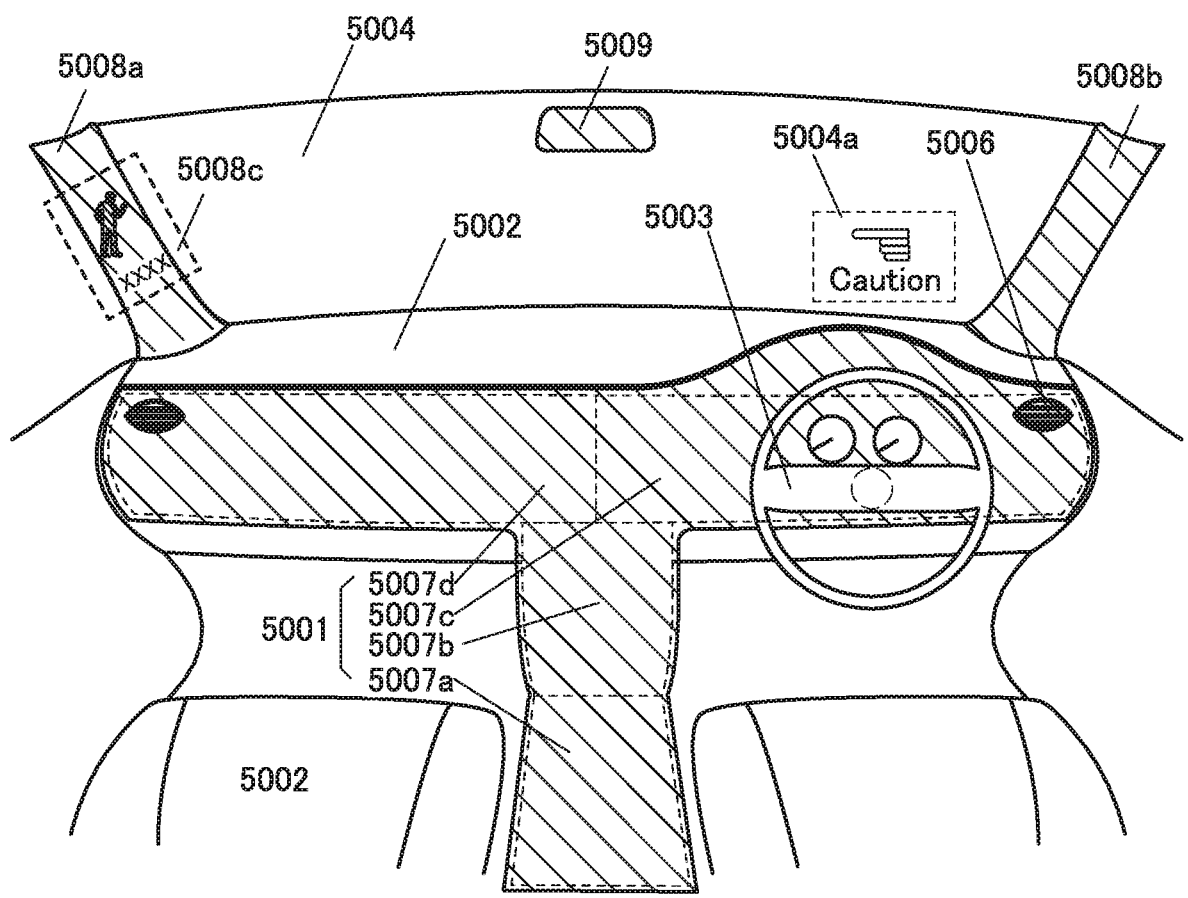

FIG. 15(B) illustrates the inside of the vehicle 5000. The vehicle 5000 includes a display unit 5001, a display panel 5008a, a display panel 5008b, and a display panel 5009. As one or more of the display unit 5001, the display panel 5008a, the display panel 5008b, and the display panel 5009, the display portion of the display system of one embodiment of the present invention can be used. Note that in the example illustrated in FIG. 15(B), the display unit 5001 is installed in a right-hand drive vehicle; however, not limited thereto, the display unit 5001 can be installed in a left-hand drive vehicle. In that case, the left and right of the arrangement shown in FIG. 15(B) are reversed.

FIG. 15(B) illustrates a dashboard 5002, a steering wheel 5003, a windshield 5004, and the like that are arranged around a driver's seat and a front passenger's seat. The display unit 5001 is placed in a predetermined position in the dashboard 5002, specifically, around the driver, and has a rough T shape. Although one display unit 5001 formed of a plurality of display panels 5007 (display panels 5007a, 5007b, 5007c, and 5007d) is provided along the dashboard 5002 in the example illustrated in FIG. 15(B), the display unit 5001 may be divided and placed in a plurality of places.

Note that the plurality of display panels 5007 may have flexibility. In this case, the display unit 5001 can be processed into a complicated shape; for example, a structure in which the display unit 5001 is provided along a curved surface of the dashboard 5002 or the like or a structure in which a display region of the display unit 5001 is not provided at a connection portion of the steering wheel, display units of meters, a ventilation duct 5006, or the like can easily be achieved.

The display panels 5008a and 5008b are each provided on a pillar portion. The display panels 5008a and 5008b can fill in the blind spots obscured by car's pillars by displaying a picture taken by an imaging unit provided on a car body (e.g., the camera 5005 illustrated in FIG. 15(A)). A picture taken by the camera 5005d can be displayed on the display panel 5008a as a picture 5008c, for example. Similarly, a picture taken by the camera 5005c is preferably displayed on the display panel 5008b.

The display panel 5009 may have a function of displaying a picture taken by an imaging unit on the rear side (e.g., the camera 5005b).

The display panels 5007, 5008a, 5008b, and 5009 may have a function of displaying legal speed, traffic information, and the like.

The display panels 5008a and 5008b are each preferably flexible. This makes it easier to provide the display panels 5008a and 5008b along the curved surfaces of the pillar portions.

A picture on the display panel provided along the curved surface might be distorted when seen from the driver's seat. Thus, the display panel preferably has a function of displaying an image that is corrected so that the distortion of the picture is reduced. For the image correction, image processing using a neural network is favorable.

Although the cameras 5005c and 5005d are provided instead of side mirrors in the example in FIGS. 15(A) and 15(B), both the side mirrors and the cameras may be provided.

As the camera 5005, a CCD camera, a CMOS camera, or the like can be used. In addition, an infrared camera may be used in combination with such a camera. The infrared camera, which has a higher output level with a higher temperature of an object, can detect or extract a living body such as a human or an animal.

An image taken by the camera 5005 can be output to one or more of the display panel 5007, the display panel 5008a, the display panel 5008b, and the display panel 5009. The display unit 5001, the display panel 5008a, the display panel 5008b, and the display panel 5009 are mainly used for drive assist. An image of a scene around the vehicle is taken at a wide angle of view by the camera 5005; the image is displayed on the display panel 5007, the display panel 5008a, the display panel 5008b, and the display panel 5009, so that the driver can see blind spots to avoid an accident.

Furthermore, the use of the display system of one embodiment of the present invention can correct the discontinuity of the picture at the junctions between the display panel 5007a, the display panel 5007b, the display panel 5007c, and the display panel 5007d. This makes it possible to display a near seamless picture, so that the visibility of the display unit 5001 during driving can be improved.

Furthermore, a distance image sensor may be provided over a roof of the vehicle, for example, and an image obtained by the distance image sensor may be displayed on the display unit 5001. For the distance image sensor, an image sensor, LIDAR (Light Detection and Ranging), or the like can be used. An image obtained by the image sensor and the image obtained by the distance image sensor are displayed on the display unit 5001, whereby more information can be provided to the driver to support driving.

The display unit 5001 may also have a function of displaying map information, traffic information, television images, DVD images, and the like. For example, map information can be displayed on the display panels 5007a, 5007b, 5007c, and 5007d as a large display screen. Note that the number of display panels 5007 can be increased depending on the image to be displayed.

Furthermore, the images displayed on the display panels 5007a, 5007b, 5007c, and 5007d can be freely set to meet the driver's preference. For example, television images or DVD images are displayed on the display panel 5007d on the left, map information is displayed on the display panel 5007b at the center position, meters are displayed on the display panel 5007c on the right, and audio information and the like are displayed on the display panel 5007a near a shift lever (or between the driver's seat and the front passenger's seat). In addition, a combination of the plurality of display panels 5007 can add a fail-safe function to the display unit 5001. For example, even when any one of the display panels 5007 is broken for any reason, a display region can be changed so that display can be performed using another display panel 5007.

The windshield 5004 includes a display panel 5004a. The display panel 5004a has a function of transmitting visible light. The driver can see a scene through the display panel 5004a. The display panel 5004a also has a function of performing display for warning the driver, for example. Although FIG. 15(B) illustrates a structure example in which the display panel 5004a is provided on the windshield 5004, one embodiment of the present invention is not limited thereto. For example, the windshield 5004 may be replaced with the display panel 5004a.

Note that this embodiment can be combined with other embodiments in this specification as appropriate.

(Notes on the description in this specification and the like)
The following are notes on the description of the structures in the above embodiments.

Notes on One Embodiment of the Present Invention Described in Embodiments

One embodiment of the present invention can be constituted by appropriately combining the structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or more of different embodiments, for example.

Note that in each embodiment, a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or more of different embodiments, much more diagrams can be formed.

<Notes on Ordinal Numbers>

Ordinal numbers such as "first", "second", and "third" in this specification and the like are used in order to avoid confusion among components. Thus, the number of components is not limited. In addition, the order of components is not limited. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.

<Notes on Description for Drawings>

Embodiments are described with reference to drawings. Note that the embodiments can be implemented in many different modes, and it will be readily appreciated by those skilled in the art that modes and details can be changed in various ways without departing from the spirit and scope. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted.

Moreover, in this specification and the like, terms for describing arrangement, such as "over" and "under", are used for convenience for describing the positional relation between components with reference to drawings. The positional relation between components is changed as appropriate in accordance with a direction in which the components are described. Thus, terms for describing arrangement are not limited to those described in this specification and can be rephrased as appropriate according to circumstances.

Furthermore, the term "over" or "under" does not necessarily mean that a component is placed directly above or directly below and in direct contact with another component. For example, the expression "an electrode Y over an insulating layer X" does not necessarily mean that the electrode Y is formed on and in direct contact with the insulating layer X and does not exclude the case where another component is provided between the insulating layer X and the electrode Y.

In drawings, the size, the layer thickness, or the region is shown arbitrarily for description convenience. Therefore, they are not limited to the scale. Note that the drawings are schematically shown for clarity, and embodiments of the present invention are not limited to shapes, values, or the like shown in the drawings. For example, variation in signal, voltage, or current due to noise or variation in signal, voltage, or current due to difference in timing can be included.

In drawings such as a perspective view, illustration of some components might be omitted for clarity of the drawings.

Moreover, the same components or components having similar functions, components formed using the same material, components formed at the same time, or the like in the drawings are denoted by the same reference numerals in some cases, and the repeated description thereof is omitted in some cases.

<Notes on Expressions that can be Rephrased>

In this specification and the like, expressions "one of a source and a drain" (or a first electrode or a first terminal) and "the other of the source and the drain" (or a second electrode or a second terminal) are used in description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances. In this specification and the like, the two terminals other than the gate may be referred to as a first terminal and a second terminal or as a third terminal and a fourth terminal. Furthermore, in the case where a transistor described in this specification and the like has two or more gates (such a structure is referred to as a dual-gate structure in some cases), these gates are referred to as a first gate and a second gate or as a front gate and a back gate in some cases. In particular, the term "front gate" can be replaced with a simple term "gate". The term "back gate" can be replaced with a simple term "gate". Note that a bottom gate is a terminal that is formed before the formation of a channel formation region in manufacture of a transistor, and a "top gate" is a terminal that is formed after the formation of a channel formation region in manufacture of a transistor.

A transistor has three terminals referred to as a gate, a source, and a drain. A gate is a terminal that functions as a control terminal that controls the conduction state of the transistor. Depending on the type of the transistor or levels of potentials supplied to the terminals, one of two input/ output terminals functions as a source and the other functions as a drain. Therefore, the terms "source" and "drain" can be used interchangeably in this specification and the like.

In addition, in this specification and the like, the term "electrode" or "wiring" does not functionally limit a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, the terms, voltage and potential, can be replaced with each other as appropriate. Voltage refers to a potential difference from a reference potential, and when the reference potential is a ground potential, for example, the term, voltage, can be replaced with the term, potential. The ground potential does not necessarily mean 0 V. Note that potentials are relative, and the potential supplied to a wiring or the like is changed depending on the reference potential, in some cases.

Note that in this specification and the like, the terms "film", "layer", and the like can be interchanged with each other depending on the case or according to circumstances. For example, the term "conductive layer" can be changed into the term "conductive film" in some cases. Moreover, the term "insulating film" can be changed into the term "insulating layer" in some cases. Alternatively, another term without the term "film", "layer", or the like can be used instead depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

Note that in this specification and the like, the terms "wiring", "signal line", "power source line", and the like can be interchanged with each other depending on the case or according to circumstances. For example, the term "wiring" can be changed into the term "signal line" in some cases. Also, for example, the term "wiring" can be changed into the term "power source line" in some cases. Inversely, the term "signal line", "power source line", or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

Notes on Definitions of Terms

Definitions of the terms mentioned in the above embodiments will be explained below.
<<Impurity in Semiconductor>>
An impurity in a semiconductor refers to, for example, an element other than the main components of a semiconductor layer. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specific examples include hydrogen (contained also in water), lithium, sodium, silicon, boron, phosphorus, carbon, and nitrogen. In the case of an oxide semiconductor, oxygen vacancies may be formed by entry of impurities such as hydrogen. Moreover, in the case where the semiconductor is a silicon layer, examples of an impurity which changes characteristics of the semiconductor include oxygen, Group 1 elements except hydrogen, Group 2 elements, Group 13 elements, and Group 15 elements.
<<Transistor>>
In this specification, a transistor is an element having at least three terminals including a gate, a drain, and a source. A channel formation region is included between the drain (a drain terminal, a drain region, or a drain electrode) and the source (a source terminal, a source region, or a source electrode). When a voltage which exceeds the threshold voltage is supplied between the gate and the source, a channel is formed in the channel formation region, whereby current can flow between the source and the drain.

Furthermore, functions of a source and a drain are sometimes interchanged with each other when a transistor with a different polarity is used or when the direction of current is changed in circuit operation, for example. Therefore, the terms "source" and "drain" can be interchanged in this specification and the like.
<<Switch>>
In this specification and the like, a switch is in a conduction state (on state) or in a non-conduction state (off state) to determine whether a current flows or not. Alternatively, a switch has a function of selecting a current path.

Examples of the switch that can be used are an electrical switch, a mechanical switch, and the like. That is, a switch can be any element capable of controlling current, and is not limited to a certain element.

Examples of the electrical switch are a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (microelectromechanical system) technology, such as a digital micromirror device (DMD). Such a switch includes an electrode which can be moved mechanically, and operates to control conduction and non-conduction with movement of the electrode.
<<Connection>>
In this specification and the like, a description X and Y are connected includes the case where X and Y are electrically connected, the case where X and Y are functionally connected, and the case where X and Y are directly connected. Accordingly, without being limited to a predetermined connection relation, for example, a connection relation shown in drawings or text, a connection relation other than the connection relation shown in drawings or text is also included.

Note that X, Y, and the like used here each denote an object (for example, a device, an element, a circuit, a wiring, an electrode, a terminal, a conductive film, or a layer).

For example, in the case where X and Y are electrically connected, one or more elements that enable electrical connection between X and Y (for example, a switch, a transistor, a capacitor, an inductor, a resistor, a diode, a display element, a light-emitting element, or a load) can be connected between X and Y. Note that the switch has a function of being controlled to be turned on or off. That is, the switch has a function of being in a conduction state (on state) or a non-conduction state (off state) to determine whether a current flows or not.

For example, in the case where X and Y are functionally connected, one or more elements that enable functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. Note that, for example, even when another circuit is interposed between X and Y, X and Y are functionally connected if a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "being electrically connected" is the same as the explicit simple expression "being connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by using an expression similar to these examples, a source (or a first terminal or the like) and a drain (or a second terminal or the like) of a transistor can be distinguished from each other to specify the technical scope. Note that these expressions are examples and expressions are not limited to them. Here, each of X, Y, Z1, and Z2 denotes an object (for example, a device, an element, a circuit, a wiring, an electrode, a terminal, a conductive film, or a layer).

Note that even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes in its category such a case where one conductive film has functions of a plurality of components.

<<Parallel and Perpendicular>>

In this specification, "parallel" indicates a state where the angle formed between two straight lines is greater than or equal to −10° and less than or equal to 10°. Accordingly, the case where the angle is greater than or equal to −50 and less than or equal to 50 is also included. In addition, "substantially parallel" indicates a state where the angle formed between two straight lines is greater than or equal to −300 and less than or equal to 300. In addition, "perpendicular" indicates a state where the angle formed between two straight lines is greater than or equal to 800 and less than or equal to 1000. Accordingly, the case where the angle is greater than or equal to 850 and less than or equal to 950 is also included. In addition, "substantially perpendicular" indicates a state where the angle formed between two straight lines is greater than or equal to 600 and less than or equal to 1200.

REFERENCE NUMERALS

Bsw: switch, Bsw2: switch, C1: capacitor, C2: capacitor, C3: capacitor, C4: capacitor, C5: capacitor, C6: capacitor, C7: capacitor, FN1: node, FN2: node, FN3: node, FN4: node, OP1: operational amplifier, OP2: operational amplifier, R1: resistor, 10: pixel region, 11: circuit, 12: circuit, 13: circuit, 14: circuit, 15: analog/digital converter circuit, 16: switch module, 17: neural network, 17a: GPU, 17b: memory device, 17c: sensor, 18: processor, 19: communication module, 21: transistor, 22: transistor, 23: transistor, 24: transistor, 25: transistor, 26: transistor, 27: transistor, 31: transistor, 32: transistor, 33: transistor, 34: transistor, 35: transistor, 36: transistor, 37: transistor, 38: transistor, 39: transistor, 41: transistor, 42: transistor, 50: photoelectric conversion element, 100: imaging device, 231: conductive layer, 232: conductive layer, 233: conductive layer, 234: conductive layer, 235: back gate, 236: region, 237: conductive layer, 240: silicon substrate, 241: insulating layer, 242: insulating layer, 243: insulating layer, 245: semiconductor layer, 246: insulating layer, 251: insulating layer, 252: insulating layer, 253: insulating layer, 280: insulating layer, 281: light-blocking layer, 282:

organic resin layer, 283: color filter, 283*a*: color filter, 283*b*: color filter, 283*c*: color filter, 284: microlens array, 285: optical conversion layer, 286: insulating layer, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 911: housing, 912: display portion, 919: camera, 932: display portion, 933: housing also serving as a wristband, 939: camera, 951: support base, 952: camera unit, 953: protective cover, 961: housing, 963: microphone, 965: lens, 967: light-emitting portion, 971: housing, 972: housing, 973: display portion, 974: operation key, 975: lens, 976: connection portion, 981: housing, 982: display portion, 983: operation button, 984: external connection port, 985: speaker, 986: microphone, 987: camera, 5000: vehicle, 5001: display unit, 5002: dashboard, 5003: steering wheel, 5004: windshield, 5004*a*: display panel, 5005: camera, 5005*a*: camera, 5005*b*: camera, 5005*c*: camera, 5005*d*: camera, 5005*e*: camera, 5005*f*: camera, 5006: ventilation duct, 5007: display panel, 5007*a*: display panel, 5007*b*: display panel, 5007*c*: display panel, 5007*d*: display panel, 5008*a*: display panel, 5008*b*: display panel, 5008*c*: picture, and 5009: display panel.

The invention claimed is:

1. An imaging device comprising a neural network interface,
    wherein:
    the imaging device includes a pixel region, a first circuit, a second circuit, a third circuit, a fourth circuit, and a first signal line Wx,
    the pixel region includes a plurality of pixels,
    a pixel of the plurality of pixels includes a first transistor,
    the fourth circuit includes the neural network interface,
    the pixel is electrically connected to the third circuit through the first signal line Wx,
    the third circuit is electrically connected to the fourth circuit,
    the first circuit has a function of supplying a scan signal to the pixel,
    the second circuit has a function of supplying a weight potential to the pixel selected by the scan signal,
    the pixel has a function of obtaining a first signal by photoelectric conversion with use of light,
    the pixel has a function of multiplying the first signal by the weight potential with use of the first transistor,
    the first transistor has a function of generating a multiplication term of the first signal by the weight potential, a first offset term, and a second offset term,
    the third circuit has a function of subtracting the first offset term,
    the fourth circuit has a function of subtracting the second offset term,
    the fourth circuit has a function of determining the multiplication term, and
    the fourth circuit outputs a determination result through the neural network interface.

2. The imaging device according to claim 1,
    wherein:
    the second circuit also has a function of supplying an offset potential to the pixel selected by the scan signal,
    the pixel has a function of generating a second signal by adding the offset potential to the first signal,
    the pixel has a function of generating a third signal by adding the weight potential to the offset potential,
    the pixel has a function of generating a fourth signal by adding the offset potential and the weight potential to the first signal,
    the first transistor has a function of generating a fifth signal by multiplying the second signal by a given number,
    the first transistor has a function of generating a sixth signal by multiplying the third signal by a given number,
    the first transistor has a function of generating a seventh signal by multiplying the fourth signal by a given number,
    the third circuit has a function of storing the second signal,
    the third circuit has a function of generating an eighth signal by performing an operation on the seventh signal and the fifth signal,
    the fourth circuit has a function of storing the eighth signal,
    the fourth circuit has a function of generating a ninth signal by performing an operation on the eighth signal and the sixth signal,
    the multiplication term of the first signal by the weight potential is output to the ninth signal,
    the fourth circuit has a function of determining the ninth signal, and
    the fourth circuit outputs a determination result through the neural network interface.

3. The imaging device according to or claim 2, further comprising:
    a second signal line Wx;
    a signal line Bsel; and
    a switch Bsw,
    wherein:
    the switch Bsw has a function of electrically connecting the first signal line Wx and the second signal line Wx in response to a signal supplied to the signal line Bsel,
    the third circuit has a function of receiving a plurality of the fifth signals, a plurality of the sixth signals, and a plurality of the seventh signals from a plurality of the pixels connected to the first signal line Wx and a plurality of the pixels connected to the second signal line Wx,
    the third circuit has a function of adding the fifth signal, the sixth signal, and the seventh signal supplied from each of the pixels and then subtracting the first offset term,
    the imaging device has a function of selecting a selection range of a plurality of the pixels in response to a signal applied to the switch Bsw, and
    pooling processing is performed in the imaging device in accordance with the selection range of the pixels.

4. The imaging device according to claim 1,
    wherein:
    the imaging device further includes an analog/digital converter circuit, a signal line Pio, and a wiring VRS,
    the pixel has a function of outputting first data to the analog/digital converter circuit through the signal line Pio,
    the pixel has a function of receiving, through the signal line Pio, a first potential supplied to the wiring VRS, and
    the pixel functions as a neural network neuron when the first potential supplied to the wiring VRS is input to the pixel through the signal line Pio.

5. The imaging device according to claim 1, wherein:
the imaging device further includes a wiring VPD, a wiring VDM, a signal line G1, a signal line G2, a signal line G3, a signal line Tx, a signal line Res, a signal line S1, and a signal line S2,
the pixel includes a photoelectric conversion element, a second transistor, a third transistor, a fourth transistor, a fifth transistor, a sixth transistor, a seventh transistor, a first capacitor, a second capacitor, and a third capacitor,
the first circuit is electrically connected to the pixel through the signal line G1,
the first circuit is electrically connected to the pixel through the signal line G2,
the first circuit is electrically connected to the pixel through the signal line G3,
the second circuit is electrically connected to the pixel through the signal line S1,
the second circuit is electrically connected to the pixel through the signal line S2,
one electrode of the photoelectric conversion element is electrically connected to the wiring VPD,
the other electrode of the photoelectric conversion element is electrically connected to one of a source and a drain of the second transistor,
a gate of the second transistor is electrically connected to the signal line Tx,
the other of the source and the drain of the second transistor is electrically connected to one of a source and a drain of the third transistor, a gate of the fourth transistor, and one electrode of the first capacitor,
the other of the source and the drain of the third transistor is electrically connected to the wiring VRS,
a gate of the third transistor is electrically connected to the signal line Res,
one of a source and a drain of the fourth transistor is electrically connected to the wiring VDM,
the other of the source and the drain of the fourth transistor is electrically connected to one of a source and a drain of the fifth transistor and one electrode of the second capacitor,
the other of the source and the drain of the fifth transistor is electrically connected to the wiring Pio,
a gate of the fifth transistor is electrically connected to the signal line G3,
the other electrode of the second capacitor is electrically connected to a gate of the first transistor, one of a source and a drain of the sixth transistor, and one electrode of the third capacitor,
one of a source and a drain of the first transistor is electrically connected to the first signal line Wx,
the other source and the drain of the sixth transistor is electrically connected to the signal line S1,
a gate of the sixth transistor is electrically connected to the signal line G1,
the other electrode of the third capacitor is electrically connected to one of a source and a drain of the seventh transistor,
the other of the source and the drain of the seventh transistor is electrically connected to the signal line S2, and
a gate of the seventh transistor is electrically connected to the signal line G2.

6. The imaging device according to claim 5, further comprising:
a signal line Csw;
a signal line Cswb;
a signal line Eabs;
a signal line Osp;
a signal line Ewx;
a signal line Mac; and
a wiring VIV,
wherein:
the third circuit includes a current mirror circuit, a memory circuit, and an output circuit,
the current mirror circuit includes an eighth transistor, a ninth transistor, a tenth transistor, an eleventh transistor, and a twelfth transistor,
the memory circuit includes a thirteenth transistor, a fourteenth transistor, a fifteenth transistor, and a fourth capacitor,
the output circuit includes a sixteenth transistor and a resistor RI,
the wiring VDM is electrically connected to one of a source and a drain of the eighth transistor and one of a source and a drain of the ninth transistor,
a gate of the eighth transistor is electrically connected to a gate of the ninth transistor, one of a source and a drain of the tenth transistor, and one of a source and a drain of the eleventh transistor,
the other of the source and the drain of the eighth transistor is electrically connected to the other of the source and the drain of the tenth transistor and one of a source and a drain of the twelfth transistor,
a gate of the tenth transistor is electrically connected to the signal line Cswb,
a gate of the eleventh transistor is electrically connected to the signal line Csw,
a gate of the twelfth transistor is electrically connected to the signal line Eabs,
the other of the source and the drain of the twelfth transistor is electrically connected to the first signal line Wx and one of a source and a drain of the sixteenth transistor,
the other of the source and the drain of the ninth transistor is electrically connected to the other of the source and the drain of the eleventh transistor, one of a source and a drain of the thirteenth transistor, and one of a source and a drain of the fourteenth transistor,
a gate of the fourteenth transistor is electrically connected to the signal line Osp,
the other of the source and the drain of the fourteenth transistor is electrically connected to one of a source and a drain of the fifteenth transistor, one electrode of the fourth capacitor, and a gate of the thirteenth transistor,
a gate of the fifteenth transistor is electrically connected to the signal line Res,
the other of the source and the drain of the sixteenth transistor is electrically connected to one electrode of the resistor R1 and the signal line Mac,
a gate of the sixteenth transistor is electrically connected to the signal line Ewx, and
the other electrode of the resistor R1 is electrically connected to the wiring VIV.

7. The imaging device according to claim 6, wherein a second potential applied to the wiring VIV is smaller than a third potential supplied to the wiring VDM.

8. The imaging device according to claim 5, wherein the photoelectric conversion element includes selenium or a compound containing selenium.

9. The imaging device according to claim 5, wherein any one or more of the first transistor, the second transistor, the fourth transistor, the sixth transistor, and the seventh transistor include a metal oxide in a channel formation region.

10. The imaging device according to claim 5, wherein the thirteenth transistor has the same channel length and channel width as the fifth transistor.

11. The imaging device according to claim 10, wherein the metal oxide includes In, Zn, and M (M is Al, Ti, Ga, Sn, Y, Zr, La, Ce, Nd, or Hf).

12. The imaging device according to claim 1, further comprising:
    a signal line Sh;
    a signal line CL;
    a signal line Out;
    a wiring VCDS; and
    a wiring JD,
    wherein:
    the fourth circuit includes a CDS circuit and a determination circuit,
    the CDS circuit includes a fifth capacitor, a sixth capacitor, an operational amplifier OP1, and a seventeenth transistor,
    the determination circuit includes a seventh capacitor, an operational amplifier OP2, and an eighteenth transistor,
    the signal line Mac is electrically connected to one electrode of the fifth capacitor,
    a first input terminal of the operational amplifier OP1 is electrically connected to the other electrode of the fifth capacitor, one electrode of the sixth capacitor, and one of a source and a drain of the seventeenth transistor,
    a gate of the seventeenth transistor is electrically connected to the signal line CL,
    a second input terminal of the operational amplifier OP1 is electrically connected to the wiring VCDS,
    an output terminal of the operational amplifier OP1 is electrically connected to the other electrode of the sixth capacitor, the other of the source and the drain of the seventeenth transistor, and one of a source and a drain of the eighteenth transistor,
    a gate of the eighteenth transistor is electrically connected to the signal line Sh,
    the other of the source and the drain of the eighteenth transistor is electrically connected to a first input terminal of the operational amplifier OP2 and one electrode of the seventh capacitor,
    a second input terminal of the operational amplifier OP2 is electrically connected to the wiring JD,
    an output terminal of the operational amplifier OP2 is electrically connected to the signal line Out, and
    the signal line Out is connected to a neural network.

13. An electronic device comprising:
    the imaging device according to claim 1, and
    a display device.

* * * * *